(12) United States Patent
Huang et al.

(10) Patent No.: US 10,707,817 B2
(45) Date of Patent: Jul. 7, 2020

(54) WIDEBAND LOW NOISE AMPLIFIER (LNA) WITH A RECONFIGURABLE BANDWIDTH FOR MILLIMETER-WAVE 5G COMMUNICATION

(71) Applicant: SPEEDLINK TECHNOLOGY INC., Cupertino, CA (US)

(72) Inventors: Min-Yu Huang, Atlanta, GA (US); Hua Wang, Atlanta, GA (US); Thomas Chen, Vancouver (CA); Taiyun Chi, Atlanta, GA (US)

(73) Assignees: SPEEDLINK TECHNOLOGY INC., Cupertino, CA (US); GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 15/993,580

(22) Filed: May 30, 2018

(65) Prior Publication Data
US 2019/0372533 A1   Dec. 5, 2019

(51) Int. Cl.
*H03F 3/193* (2006.01)
*H03F 1/26* (2006.01)
*H03G 3/30* (2006.01)
*H04B 1/16* (2006.01)

(52) U.S. Cl.
CPC .............. *H03F 3/193* (2013.01); *H03F 1/26* (2013.01); *H03G 3/3052* (2013.01); *H04B 1/16* (2013.01); *H03F 2200/09* (2013.01); *H03F 2200/171* (2013.01); *H03F 2200/222* (2013.01); *H03F 2200/225* (2013.01); *H03F 2200/255* (2013.01); *H03F 2200/267* (2013.01); *H03F 2200/294* (2013.01); *H03F 2200/297* (2013.01); *H03F 2200/301* (2013.01); *H03F 2200/309* (2013.01); *H03F 2200/318* (2013.01); *H03F 2200/336* (2013.01); *H03F 2200/378* (2013.01); *H03F 2200/387* (2013.01); *H03F 2200/391* (2013.01); *H03F 2200/423* (2013.01); *H03F 2200/451* (2013.01); *H03F 2200/48* (2013.01); *H03F 2200/546* (2013.01); *H03G 2201/103* (2013.01); *H03G 2201/206* (2013.01)

(58) Field of Classification Search
USPC ................... 330/278, 310–311, 302, 98, 150
See application file for complete search history.

(56) References Cited

U.S. PATENT DOCUMENTS 8,994,456 B2 * 3/2015 Sanduleanu ............ H03F 1/223
330/305

* cited by examiner

*Primary Examiner* — Hieu P Nguyen
(74) *Attorney, Agent, or Firm* — Womble Bond Dickinson (US) LLP

(57) ABSTRACT

According to one embodiment, a low noise amplifier (LNA) circuit includes a first stage which includes: a first transistor; a second transistor coupled to the first transistor; a first inductor coupled in between an input port and a gate of the first transistor; and a second inductor coupled to a source of the first transistor, where the first inductor and the second inductor resonates with a gate capacitance of the first transistor for a dual-resonance. The LNA circuit includes a second stage including a third transistor; a fourth transistor coupled between the third transistor and an output port; and a passive network coupled to a gate of the third transistor. The LNA circuit includes a capacitor coupled in between the first and the second stages, where the capacitor transforms an impedance of the passive network to an optimal load for the first amplifier stage.

20 Claims, 25 Drawing Sheets (a)

WIDEBAND LOW NOISE AMPLIFIER (LNA) WITH A RECONFIGURABLE BANDWIDTH FOR MILLIMETER-WAVE 5G COMMUNICATION

FIELD OF THE INVENTION

Embodiments of the present invention relate generally to wireless communication devices. More particularly, embodiments of the invention relate to a wideband low noise amplifier (LNA) with a reconfigurable bandwidth for a communication device.

BACKGROUND

For next-generation 5G communication devices, a higher data rate is required for many applications such as augmented reality (AR)/virtual reality (VR), and 5G multiple-input and multiple-output (MIMO). A design shift towards millimeter-wave (mm-Wave) frequency supports this higher data rate. Meanwhile, a broader bandwidth is required to facilitate the higher data rate. For example, a broader bandwidth should cover the 5G spectrum including the 24, 28, 37, and 39 GHz bands.

Conventional RF frontend LNA circuits have a limited performance at high frequency operations due to high frequency parasitic effects of the LNA components. This often leads to a lower bandwidth, input impedance mismatches, and a degraded noise figure for the RF frontend circuit.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
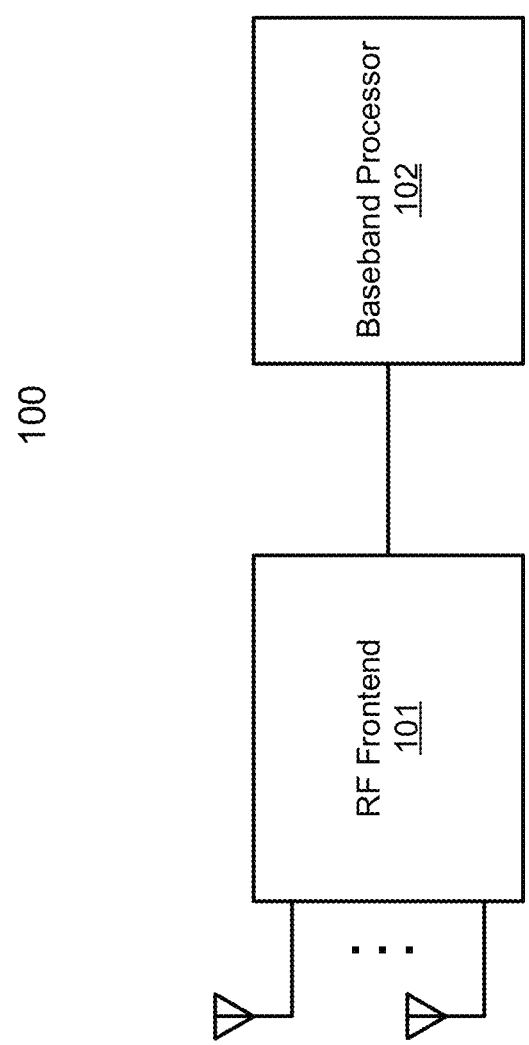
FIG. 1 is a block diagram illustrating an example of a wireless communication device according one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

For purposes of the embodiments described herein, unless otherwise specified, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, etc., may be used without departing from the scope of the disclosure.

According to a first aspect, a low noise amplifier (LNA) circuit includes a first amplifier stage which includes: a first transistor; a second transistor coupled to the first transistor; a first inductor coupled in between an input port and a gate of the first transistor; and a second inductor coupled to a source of the first transistor, where the first inductor and the second inductor resonates with gate capacitance(s) (e.g., Cgs or Cgd) and/or source capacitance(s) (e.g., Cgs or Cds) of the first transistor respectively for a dual-resonance input matching. The LNA circuit includes a second amplifier stage including a third transistor; a fourth transistor coupled between the third transistor and an output port; and a passive network coupled to a gate of the third transistor. The LNA circuit includes a capacitor coupled in between the first and the second amplifier stages, where the capacitor transforms a gate capacitance of the third transistor and/or an impedance of the passive network to an optimal load for the first amplifier stage.

In one embodiment, the LNA circuit further includes a third inductor coupled in between the first transistor and the second transistor for a C-L-C transmission line for the first amplifier stage to deliver a signal from the first transistor to the second transistor. In one embodiment, the LNA circuit further includes a variable gain controller coupled to the first amplifier stage to control a gain of the first amplifier stage. In one embodiment, the LNA circuit further includes a fourth inductor coupled to a drain of the second transistor to resonate with a drain capacitance of the second transistor at a first resonance. In one embodiment, wherein the passive network comprises a fifth inductor in parallel with a first resistor.

In one embodiment, the LNA circuit further includes a sixth inductor coupled in between the third transistor and the fourth transistor for a C-L-C transmission line for the second amplifier stage to deliver an amplifier signal from the third transistor to the fourth transistor. In one embodiment, the LNA circuit further includes a transformer-based balun coupled between the output port and the fourth transistor, wherein a primary winding of a transformer of the transformer-based balun is to resonate with a drain capacitance of the fourth transistor at a second resonance.

In one embodiment, the LNA circuit further includes a first capacitor bank coupled in parallel with the first inductor. In another embodiment, the LNA circuit further includes a second capacitor bank coupled in parallel with the fourth inductor. In another embodiment, the LNA circuit further includes a third capacitor bank coupled in parallel with the capacitor. In another embodiment, the LNA circuit further includes a fourth capacitor bank coupled in parallel with the primary winding of the transformer of the transformer-based balun. In another embodiment, the first, the second, the third, and the fourth capacitor banks are programmable capacitors. In another embodiment, the first, the second, the third, and the fourth capacitor banks are digitally (or analog-based) tunable capacitors.

According to a second aspect, a RF receiver circuit includes an LNA circuit to amplify a received signal, the LNA circuit includes a first amplifier stage which includes: a first transistor; a second transistor coupled to the first transistor; a first inductor coupled in between an input port and a gate of the first transistor; and a second inductor coupled to a source of the first transistor, where the first inductor and the second inductor resonates with gate capacitance(s) (e.g., Cgs or Cgd) and/or source capacitance(s) (e.g., Cgs or Cds) of the first transistor respectively for a dual-resonance input matching. The LNA circuit includes a second amplifier stage including a third transistor; a fourth transistor coupled between the third transistor and an output port; and a passive network coupled to a gate of the third transistor. The LNA circuit includes a capacitor coupled in between the first and the second amplifier stages, where the capacitor transforms a gate capacitance of the third transistor and/or an impedance of the passive network to an optimal load for the first amplifier stage.

According to a third aspect, a RF frontend circuit includes an RF receiver to receive an RF signal, the RF receiver includes an LNA RF receiver circuit includes an LNA circuit to amplify the received RF signal, the LNA circuit includes a first amplifier stage which includes: a first transistor; a second transistor coupled to the first transistor; a first inductor coupled in between an input port and a gate of the first transistor; and a second inductor coupled to a source of the first transistor, where the first inductor and the second inductor resonates with gate capacitance(s) (e.g., Cgs or Cgd) and/or source capacitance(s) (e.g., Cgs or Cds) of the first transistor respectively for a dual-resonance input matching. The LNA circuit includes a second amplifier stage including a third transistor; a fourth transistor coupled between the third transistor and an output port; and a passive network coupled to a gate of the third transistor. The LNA circuit includes a capacitor coupled in between the first and the second amplifier stages, where the capacitor transforms a gate capacitance of the third transistor and/or an impedance of the passive network to an optimal load for the first amplifier stage.

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or TOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower frequency, e.g., IF. In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip further includes an IQ generator and/or a frequency synthesizer coupled to the RF transceivers. The IQ generator or generation circuit generates and provides an LO signal to each of the RF transceivers to enable the RF transceiver to mix, modulate, and/or demodulate RF signals within a corresponding frequency band. The RF transceiver(s) and the IQ generation circuit may be integrated within a single IC chip as a single RF frontend IC chip or package.

Figure 2:
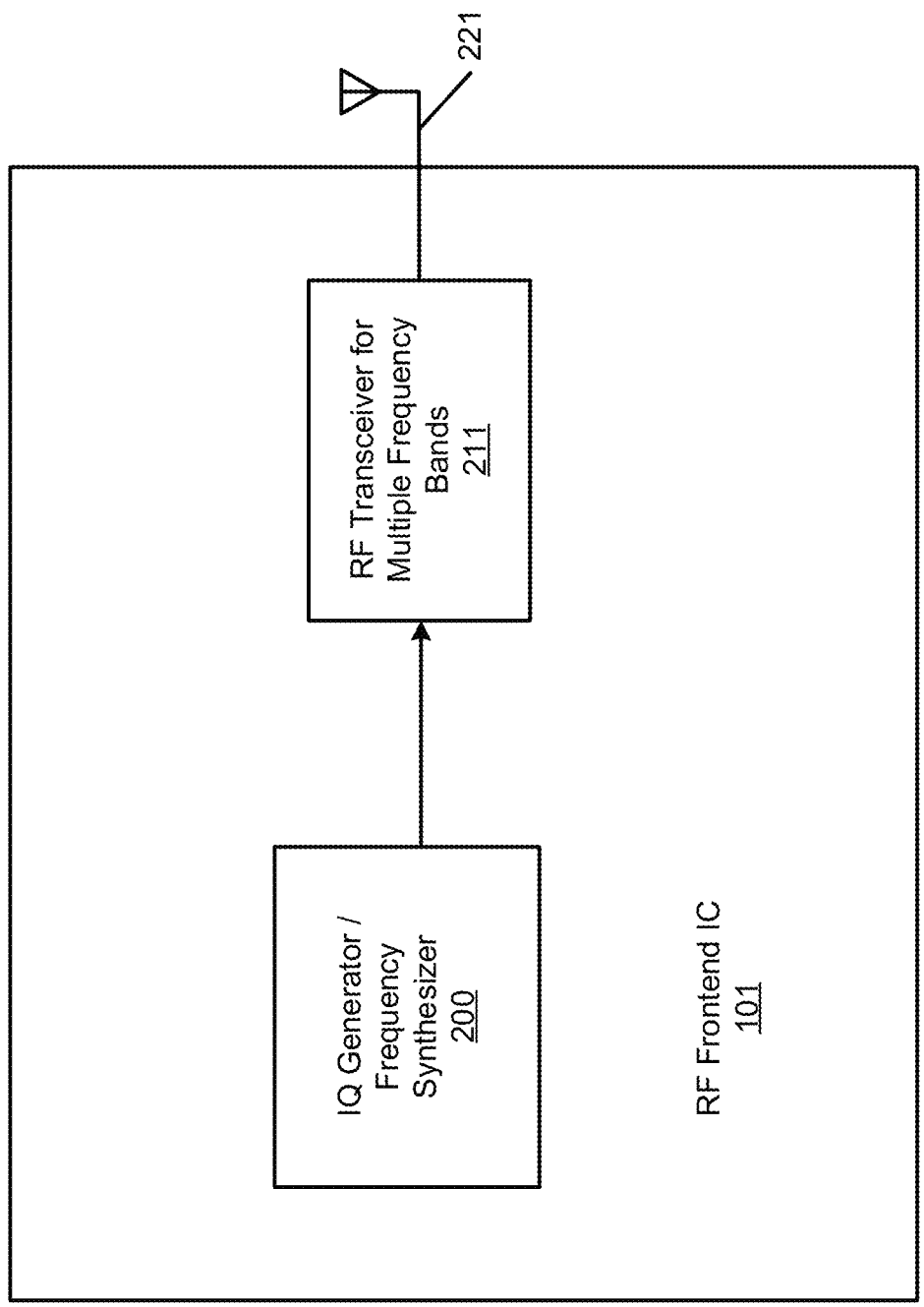
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, amongst others, an IQ generator and/or frequency synthesizer 200 coupled to a multi-band RF transceiver 211. Transceiver 211 is configured to transmit and receive RF signals within one or more frequency bands or a broad range of RF frequencies via RF antenna 221. In one embodiment, transceiver 211 is configured to receive one or more LO signals from IQ generator and/or frequency synthesizer 200. The LO signals are generated for the one or more corresponding frequency bands. The LO signals are utilized to mix, modulate, demodulated by the transceiver for the purpose of transmitting and receiving RF signals within corresponding frequency bands. Although there is only one transceiver and antenna shown, multiple pairs of transceivers and antennas can be implemented, one for each frequency bands.

Figure 3:
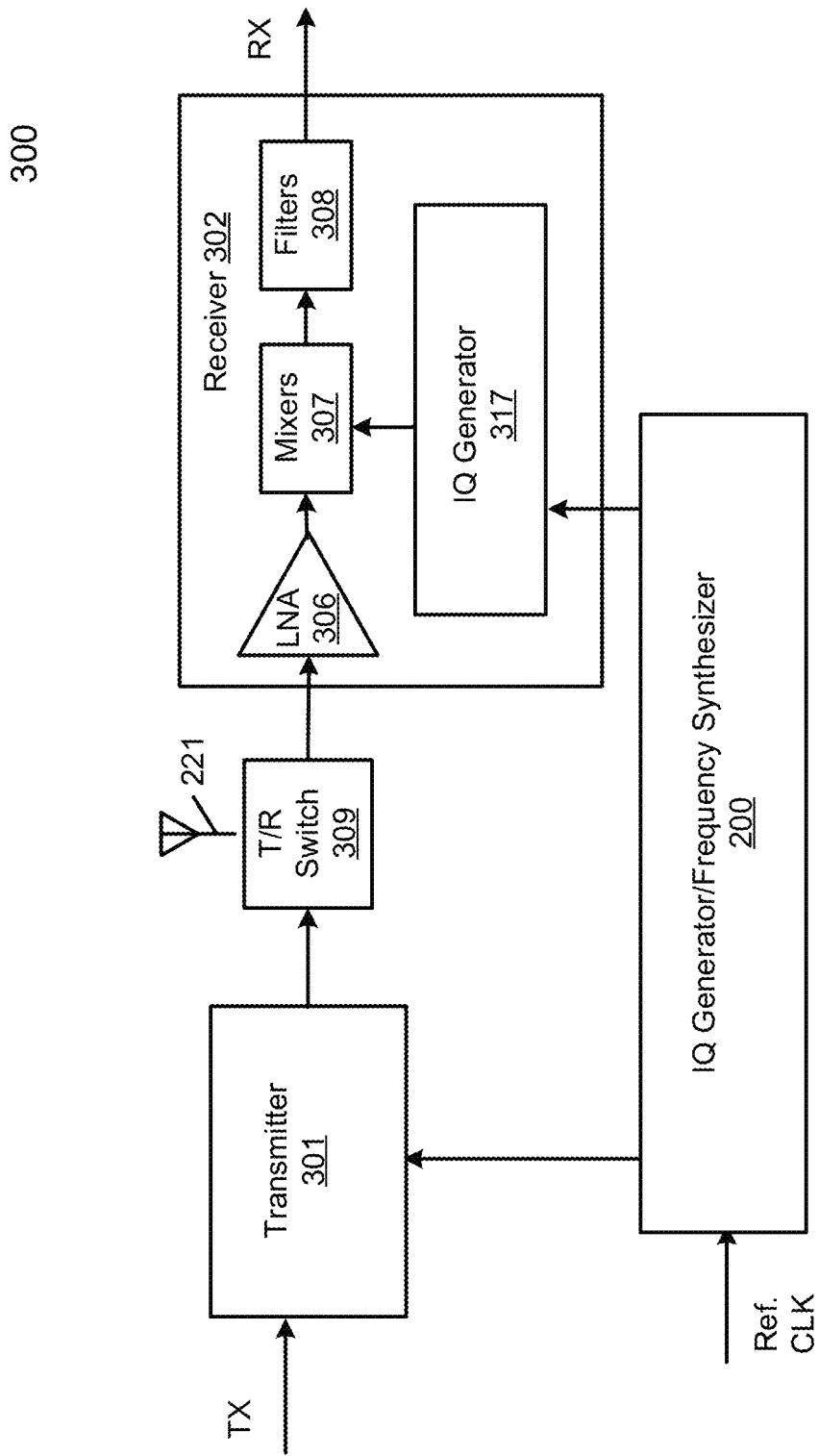
FIG. 3 is a block diagram illustrating an RF transceiver integrated circuit according to one embodiment.

FIG. 3 is a block diagram illustrating an RF transceiver integrated circuit (IC) according to one embodiment. RF transceiver 300 may represent RF transceiver 211 of FIG. 2. Referring to FIG. 3, frequency synthesizer 200 may represent frequency synthesizer 200 as described above. In one embodiment, RF transceiver 300 can include frequency synthesizer 200, transmitter 301, and receiver 302. Frequency synthesizer 200 is communicatively coupled to transmitter 301 and receiver 302 to provide LO signals. Transmitter 301 can transmit RF signals for a number of frequency bands. Receiver 302 can receive RF signals for a number of frequency bands.

Receiver 302 includes a low noise amplifier (LNA) 306, mixer(s) 307, and filter(s) 308. LNA 306 is to receive RF signals from a remote transmitter via antenna 221 and to amplify the received RF signals. The amplified RF signals are then demodulated by mixer(s) 307 (also referred to as a down-convert mixer) based on an LO signal provided by IQ generator 317. IQ generator 317 may represent an IQ generator of IQ generator/synthesizer 200 as described above. In one embodiment, IQ generator 317 is integrated into broadband receiver 302 as a single integrated circuit. The demodulated signals are then processed by filter(s) 308, which may be a low-pass filter. In one embodiment, transmitter 301 and receiver 302 share antenna 221 via a transmitting and receiving (T/R) switch 309. T/R switch 309 is configured to switch between transmitter 301 and receiver 302 to couple antenna 221 to either transmitter 301 or receiver 302 at a particular point in time. Although there is one pair of transmitter and receiver shown, multiple pairs of transmitters and receivers and/or a standalone receiver can be implemented.

Figure 4:
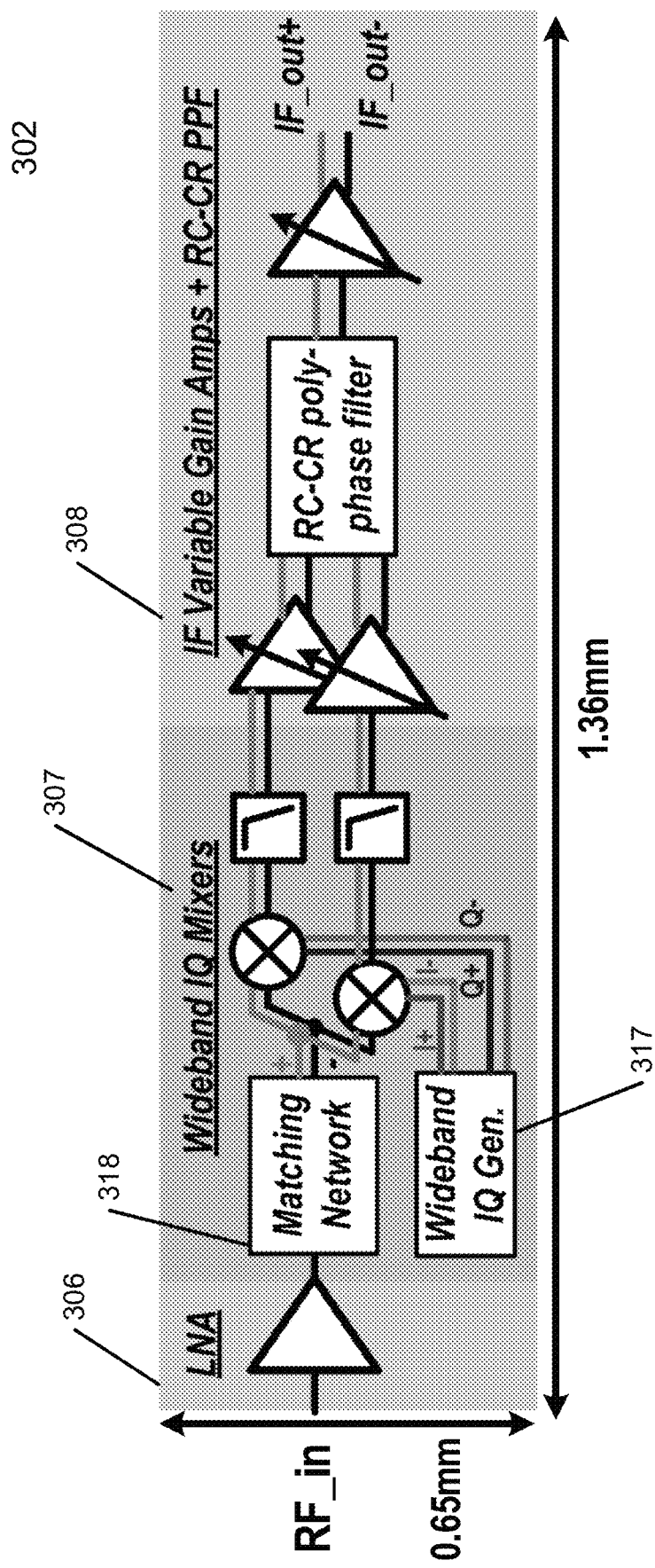
FIG. 4 is a block diagram illustrating an example of a wideband receiver circuit according to one embodiment.

FIG. 4 is a block diagram illustrating an example of a wideband LNA 306, wideband IQ mixers 307, and filter 308. Filter 308 can be a two-stage resistors capacitors (e.g., RC-CR) poly-phase filter. Filter 308 can include one or more variable gain intermediate frequency (IF) amplifiers for additional power gain. Note wideband IQ mixers 307 can be co-designed with wideband IQ generation circuit 317 as a single unit. Wideband IQ mixers 307 can also include a matching network 318 for impedance matching between LNA 306 and mixers 307.

Figure 5:
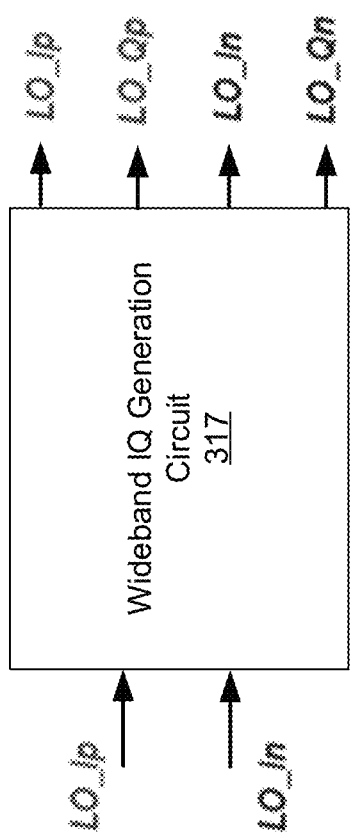
FIG. 5 is a block diagram illustrating a wideband IQ generation circuit according to one embodiment.

FIG. 5 is a block diagram illustrating a mm-wave wideband IQ generation circuit according to one embodiment. Referring to FIG. 5, wideband IQ generation circuit 317 can generate IQ signals (e.g., LO_Ip, LO_Qp, LO_In, and LO_Qn) based on a differential LO signal (e.g., LO_Ip and LO_In) over a wide range of frequencies. The IQ generation circuit 317 introduces 90 degrees phase shift to the LO signals to generate signals in the four phase quadrants. IQ signals can then be used by an IQ mixer to modulate RF signals having IQ data to a lower frequency signal (e.g., IF signal).

Figure 6:
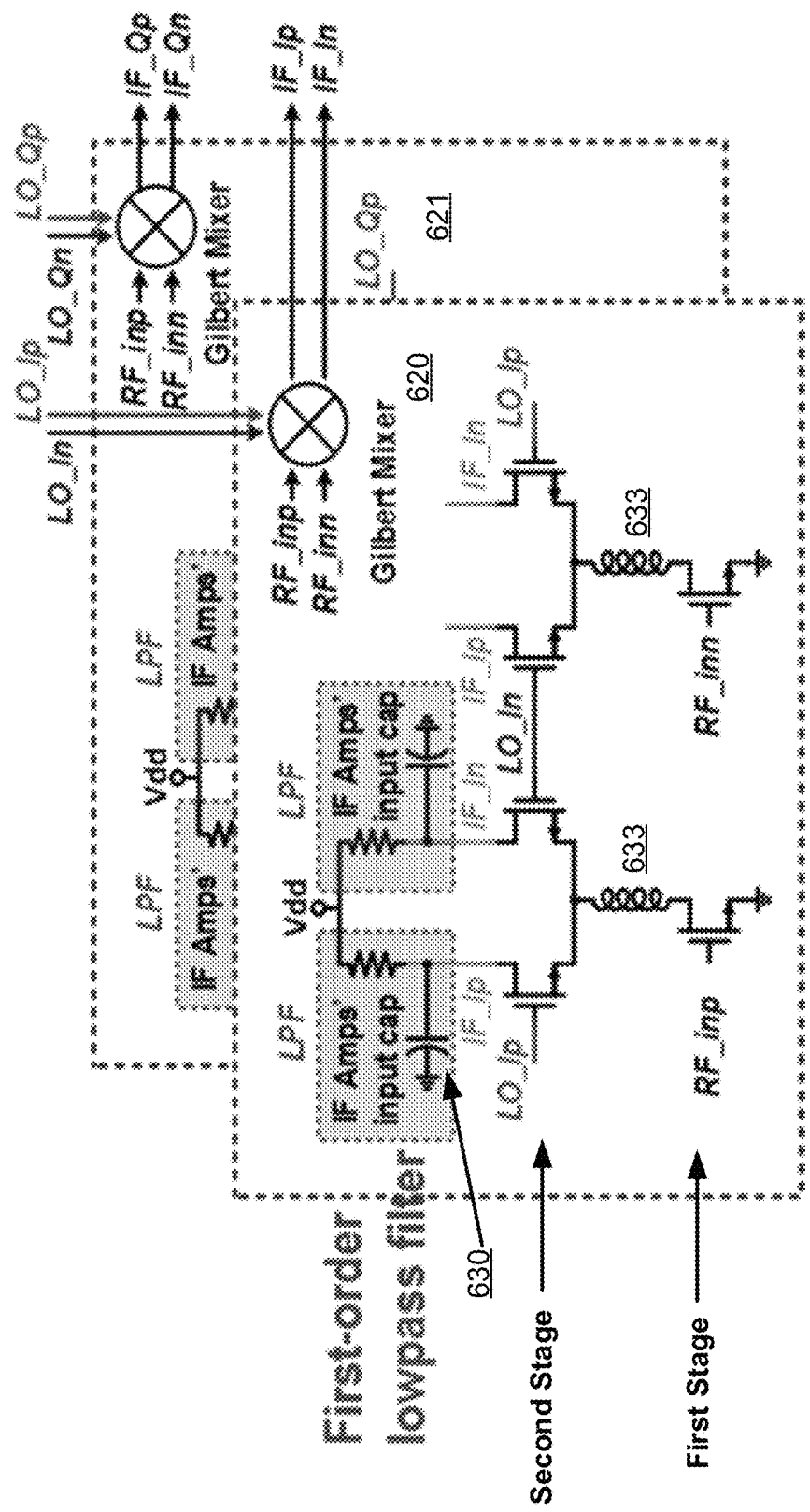
FIG. 6 is a block diagram illustrating broadband IQ mixers according to one embodiment.

FIG. 6 is a block diagram illustrating broadband IQ mixers according to one embodiment. A mixer is a three port device that can perform a frequency conversion or modulation of a signal. For a receiver, a mixer down converts (or demodulates) an RF signal using an LO signal to generate an IF signal. Referring to FIG. 6, mixers 307 includes two (or double) balanced Gilbert mixers 620-621. Double balanced mixers 620-621 down convert (or demodulate) a differential RF signal using differential LO signals to generate differential IF signals. For example, mixer 620 receives RF_inp, RF_inn, and differential in-phase signals (e.g., LO_Ip and LO_In) generated by a mm-wave wideband IQ generation circuit, such as IQ generator 317 of FIG. 5, to generate IF_Ip and IF_In. Similarly, mixer 621 receives RF_inp, RF_inn, and differential quadrature signals (e.g., LO_Qp and LO_Qn) generated by a mm-wave wideband IQ generation circuit, such as IQ generator 317 of FIG. 5, to generate IF_Qp and IF_Qn. In some embodiments, each of mixers 620-621 can include one or more differential amplifier stages.

Referring to FIG. 6, for a two stage differential amplifier, the amplifier can include a common source differential amplifier as the first stage and a gate-coupled differential amplifier as the second stage. The common source differential amplifier stage of mixers 620-621 each can receive differential signals RF_inp and RF_inn. The gate-coupled differential amplifier stage of mixer 620 receives differential signals LO_In and LO_Ip. The gate-coupled differential amplifier stage of mixer 621 receives differential signals LO_Qn and LO_Qp. The RF signal is then down converted by the LO signal to generate an IF signal. The second stage can include a low-pass filter which can be first order low-pass filters to minimize high frequency noise injections into mixers 620-621. In one embodiment, the low-pass filter includes a passive low pass filter having a load resistor in parallel with a capacitor (e.g., capacitor 630). In one embodiment, the first stage different amplifier is coupled to the second stage differential amplifier via differential inductors (e.g., differential inductors 633). In one embodiment, mixers 620-621 is co-designed with a mm-wave IQ generation circuit such as mm-wave IQ generation circuit 317 of FIG. 5 on a single monolithic integrated circuit.

Figure 7B:
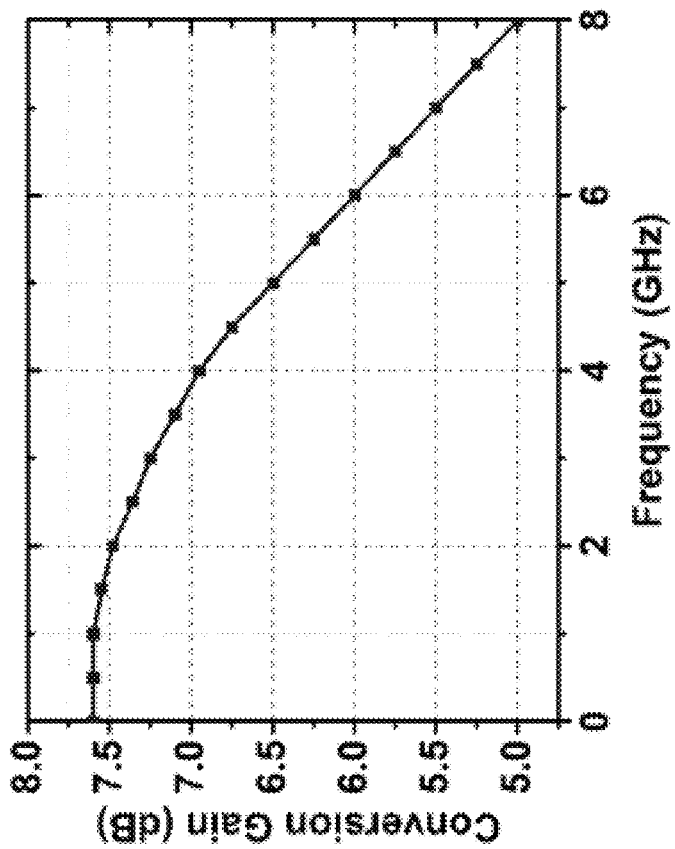
FIG. 7B illustrates a simulation graph for conversion gain versus intermediate frequency (IF) between 0 to 8 GHz for a co-designed mm-wave IQ generation circuit of FIG. 5 and broadband IQ mixer of FIG. 6 according to one embodiment.
Figure 7A:
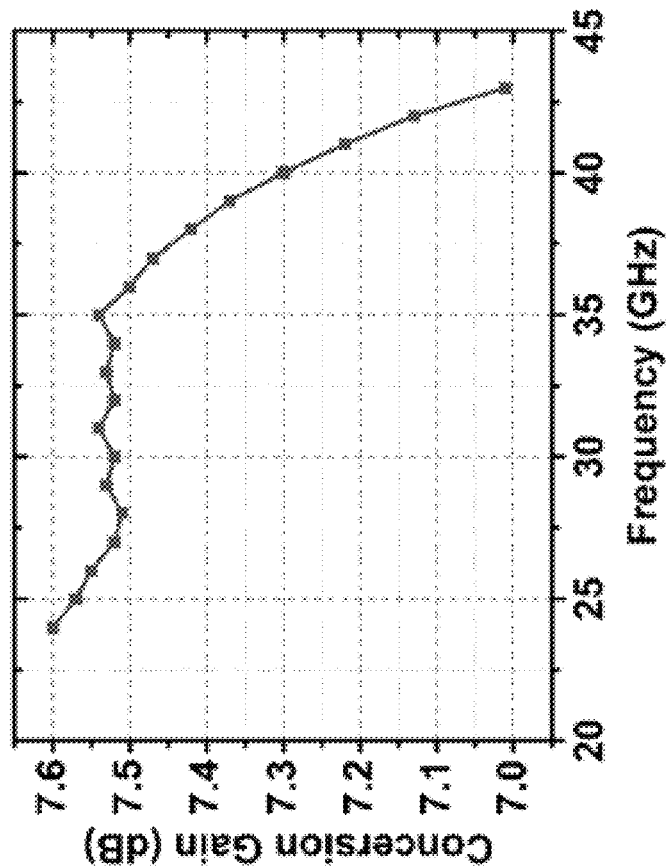
FIG. 7A illustrates a simulation graph for conversion gain versus local oscillator (LO) frequency between 20 to 45 GHz for a co-designed mm-wave IQ generation circuit of FIG. 5 and broadband IQ mixer of FIG. 6 according to one embodiment.

FIG. 7A illustrates a simulation graph for conversion gain versus local oscillator (LO) frequency between 20 to 45 GHz for a co-designed mm-wave IQ generation circuit of FIG. 5 and broadband IQ mixer of FIG. 6 according to one embodiment. Referring to FIG. 7A, With a moderate differential power such as a LO signal with a differential power of about −2 dBm at the input of the IQ generation circuit, IQ mixers 307 can yield a down-conversion gain of approximately >7 dB and an amplitude mismatch of approximately <0.7 dB over a LO frequency range of 23 to 43 GHz.

FIG. 7B illustrates a simulation graph for conversion gain versus intermediate frequency (IF) between 0 to 8 GHz for a co-designed mm-wave IQ generation circuit of FIG. 5 and broadband IQ mixer of FIG. 6 according to one embodiment. Referring to FIG. 6, output load resistors of the mixer 620/621 can be co-designed in parallel with input capacitors 630, which may be parasitic capacitances seen at a next IF amplifier stage, e.g., IF variable gain amplifier stage 308 of FIG. 4, to form a first-order low pass filter. Referring to FIG. 7B, based on the co-designed mm-wave IQ generation circuit and IQ mixers, a conversion gain degradation can be reduced to about 0.5 dB from a peak gain of about 7.6 dB for an IF frequency designed at about 3.5 GHz.

Figure 8:
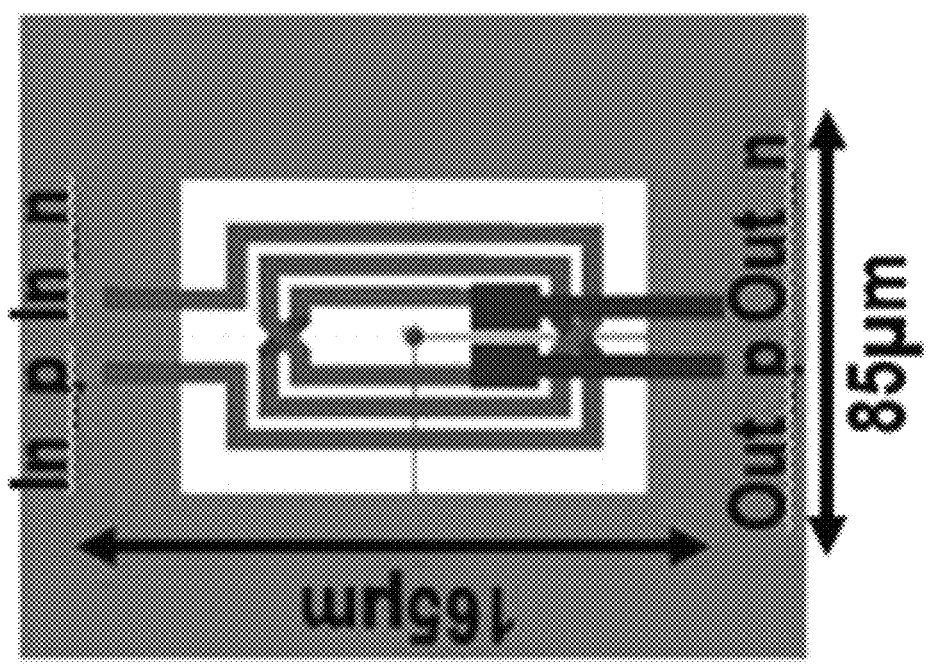
FIG. 8 illustrates a three dimensional model of a differential inductor pair according to one embodiment.

Referring to FIG. 6, differential inductor pair 633 is used to pick up a current gain between the two differential amplifier stages. Four inductors are included for good performance, e.g., two differential inductor pairs are used for each of the double IQ mixers. Four inductors, however, include a large foot. FIG. 8 illustrates a three dimensional model of a differential inductor pair according to one embodiment. Differential inductor pair 800 may be differential inductor pair 633 of FIG. 6. In one embodiment, a differential inductor pair can be reduced to a single inductor footprint, such as differential inductor pair 800 of FIG. 8. Referring to FIG. 8, differential inductor pair 800 includes two spiral inductors folded together into a footprint of a single inductor due to the fact that there is a virtual ground between the inductor pairs, and thus, a ground plane (e.g., a ground plane surrounding the inductors) can be reused for the pair of inductors to reduce the inductor pair footprint. In one embodiment, differential inductor pair 800 can each have about 200 pH of inductance. In one embodiment, the inductor pair has a footprint of about 165 µm by 85 µm.

Figure 9:
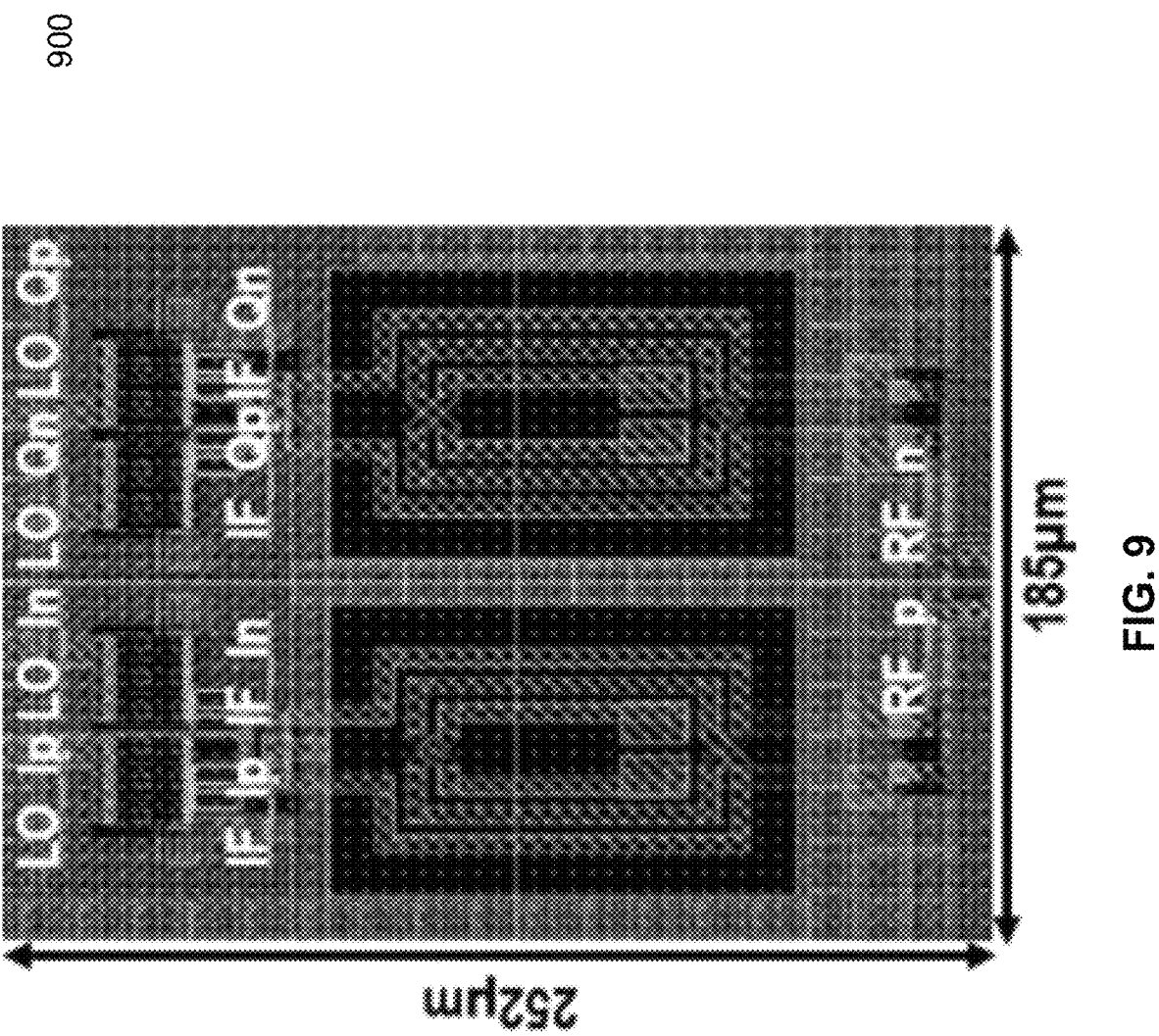
FIG. 9 illustrates a layout model of a double balanced mixer each with a differential inductor pair according to one embodiment.
Figure 10:
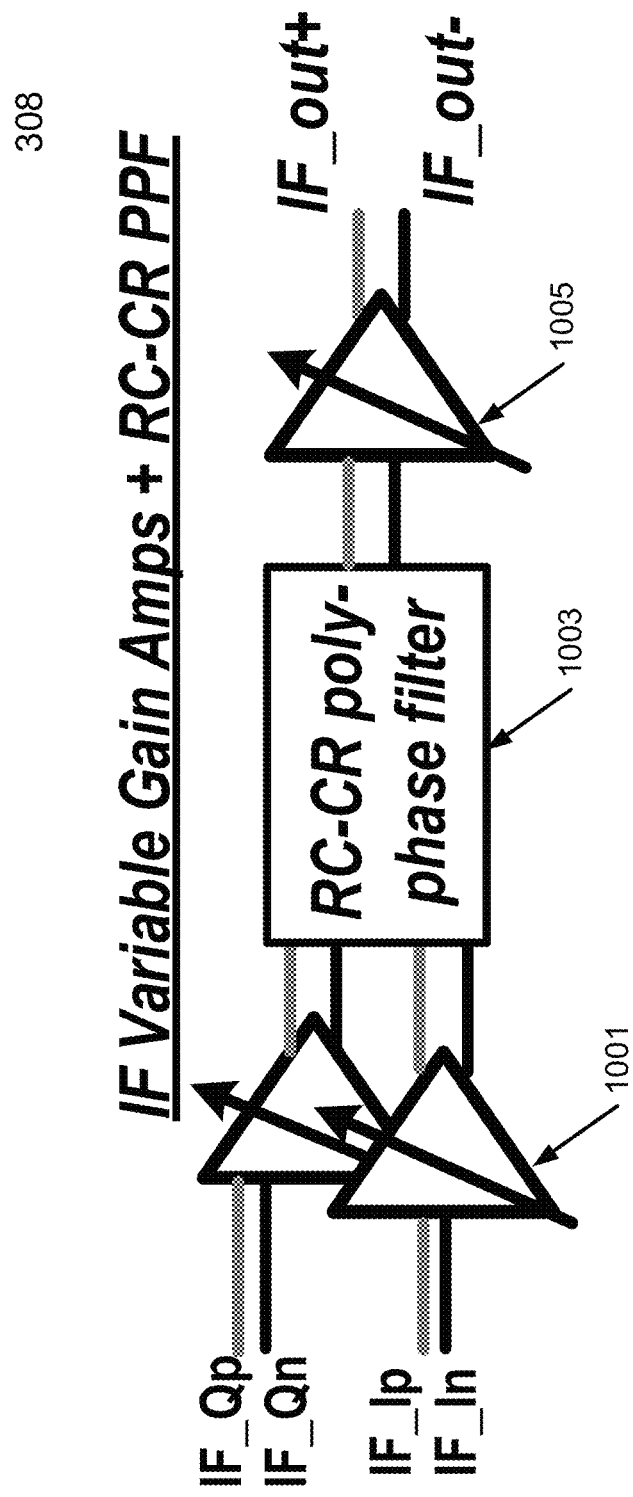
FIG. 10 is a block diagram illustrating a poly-phase filter (PPF) circuit according to one embodiment.

FIG. 9 illustrates a layout model of a double balanced mixer each with a differential inductor pair of FIG. 8 according to one embodiment. Referring to FIG. 9, double balanced mixer 900 can be IQ mixers 620-621 of FIG. 6. As shown by FIG. 9, two inductor pairs (e.g., 4 inductors in total) are each coupled between a first stage amplifier and a second stage amplifier. The inductor pair applies an inductance between the two stages to enhance a current gain over a mm-wave frequency range. The inductors of the differential inductor pair share a virtual ground and have a single inductor footprint. In one embodiment, the mixer footprint is approximately 185 µm by 252 µm. FIG. 10 is a block diagram illustrating a poly-phase filter (PPF) circuit according to one embodiment. PPF 308 can filter out higher frequency noise and can recombine the four in-phase and quadrature signals back into a differential pair of IF signals, e.g., IF_Ip and IF_In. In one embodiment, PPF 308 includes one or more amplifier stages to further amplify an IF signal. Referring to FIG. 10, in one embodiment, PPF 308 includes three stages. A first stage includes differential amplifiers 1001 to increase the power of the IQ IF signals, e.g., IF_Ip, IF_In, IF_Qp, and IF_Qn. A second stage includes a resistive-capacitive capacitive-resistive (RC_CR) PPF 1003. PPF 1003 can filter out undesirable signal noise, e.g., high frequency noise outside the range of the IF frequencies, and can combine the four in-phase and quadrature signals, e.g., IF_Ip, IF_In, IF_Qp, and IF_Qn, into a differential pair of IF signals, e.g., IF_Ip and IF_In. Finally, a third stage includes an amplifier 1005 to further amplify the differential IF signals IF_Ip and IF_In to generate IF_out+ and IF_out−. Amplifiers 1001 and amplifiers 1005 can be variable gain amplifiers to allow for gain adjustments for the PPF circuit 308.

Figure 11:
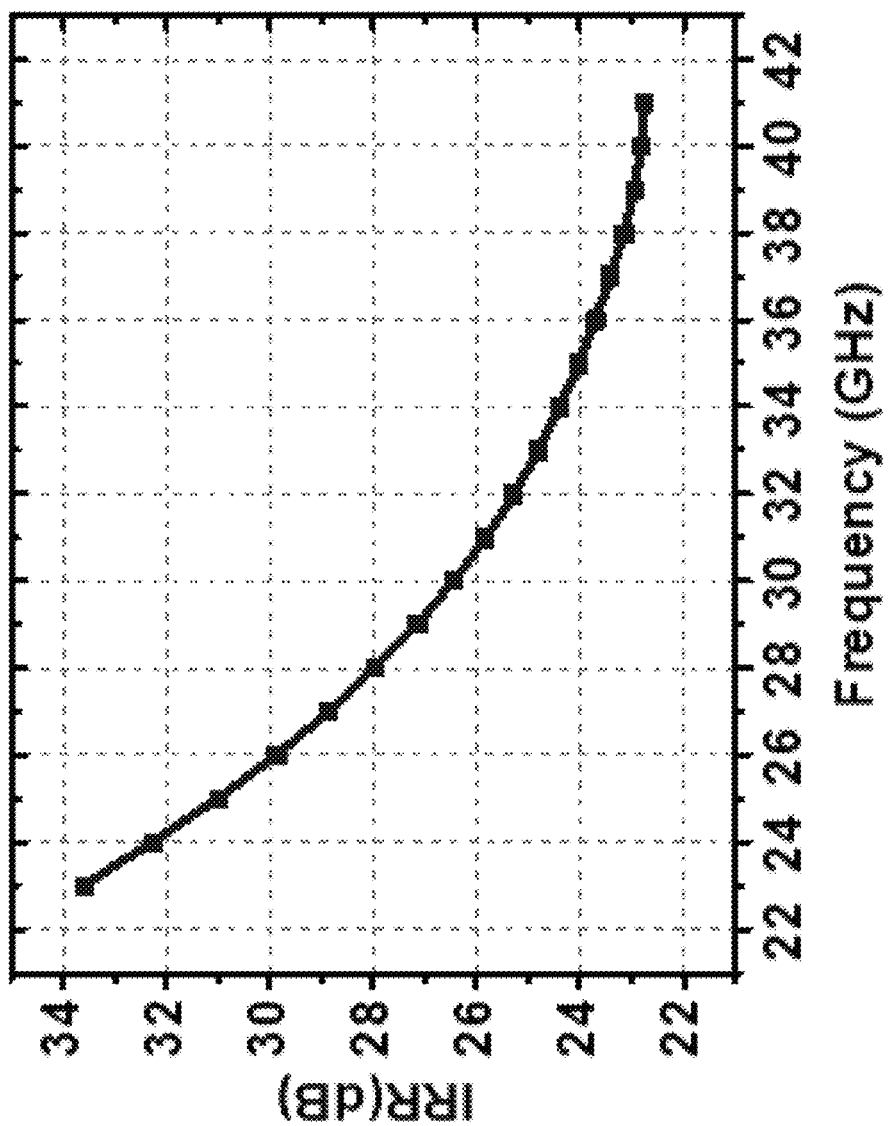
FIG. 11 is a simulation graph illustrating image rejection ratio vs RF frequency from 22 to 39 GHz under a fixed IF frequency of 3.5 GHz for the wideband receiver circuit of FIG. 4, according to one embodiment.

FIG. 11 is a simulation graph illustrating image rejection ratio vs RF frequency from 22 to 39 GHz under an IF frequency of approximately 3.5 GHz for the broadband receiver circuit (e.g., receiver 302) of FIG. 4, according to one embodiment. The simulation setup includes a differential LO with a driving power ranging from −2 to +3 dBm as the input. Under the IF frequency of approximately 3.5 GHz, the wideband imaging rejection ratio (IRR) is approximately >23 dB for a frequency range of about 22 to 39 GHz. Broadband receiver 302 occupies approximately 1.36 mm by 0.65 mm according to one embodiment.

Figure 12:
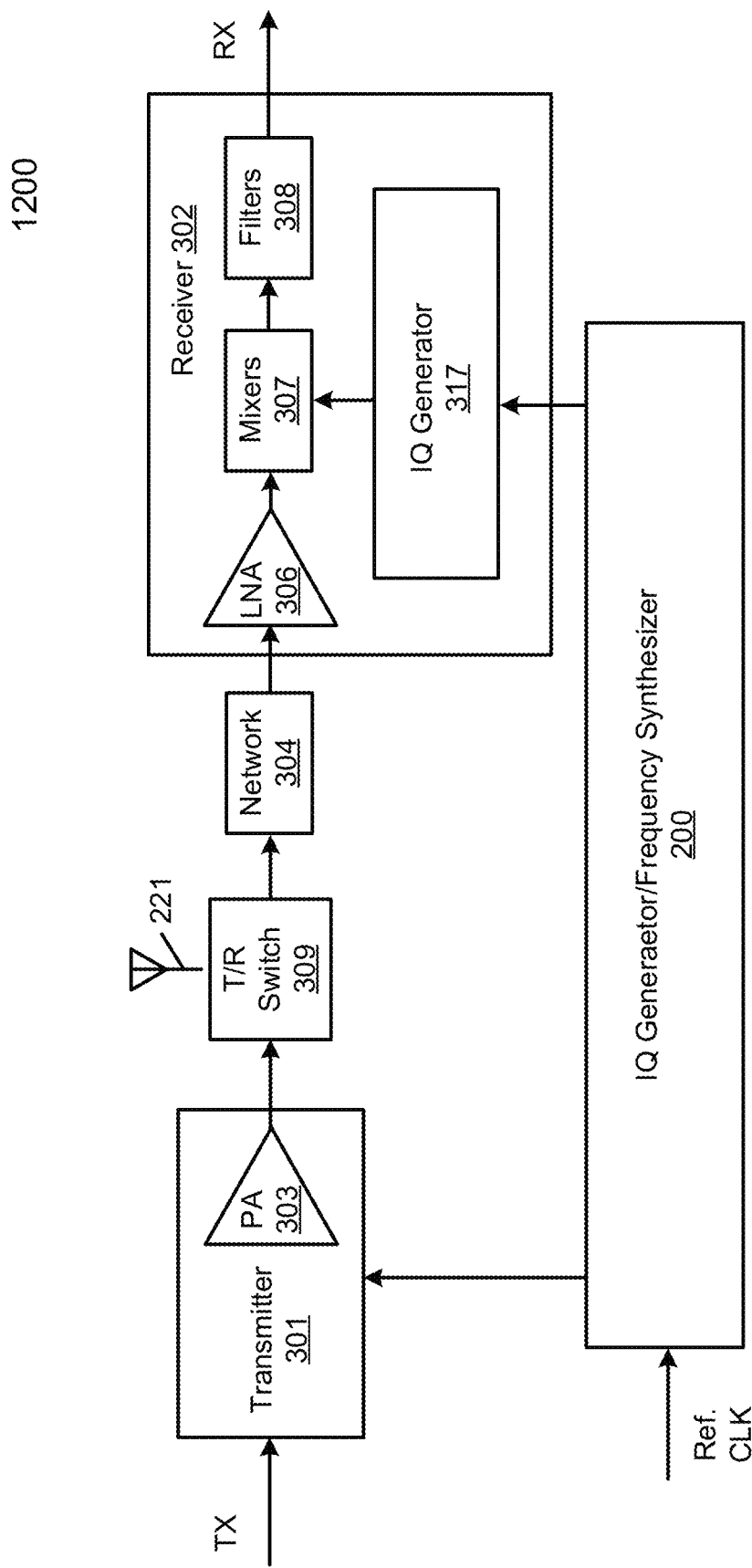
FIG. 12 is a block diagram illustrating an RF transceiver integrated circuit according to one embodiment.

FIG. 12 is a block diagram illustrating an RF transceiver integrated circuit according to one embodiment. RF transceiver 1200 can be transceiver 300 of FIG. 3. In one embodiment, RF transceiver 1200 includes co-design matching network 304 which is coupled in between T/R switch 309 and LNA 306 of receiver 302. Matching network 304 co-designed with T/R switch 309 and LNA 306 can improve a performance of receiver 302.

Figures 13A, 13B:
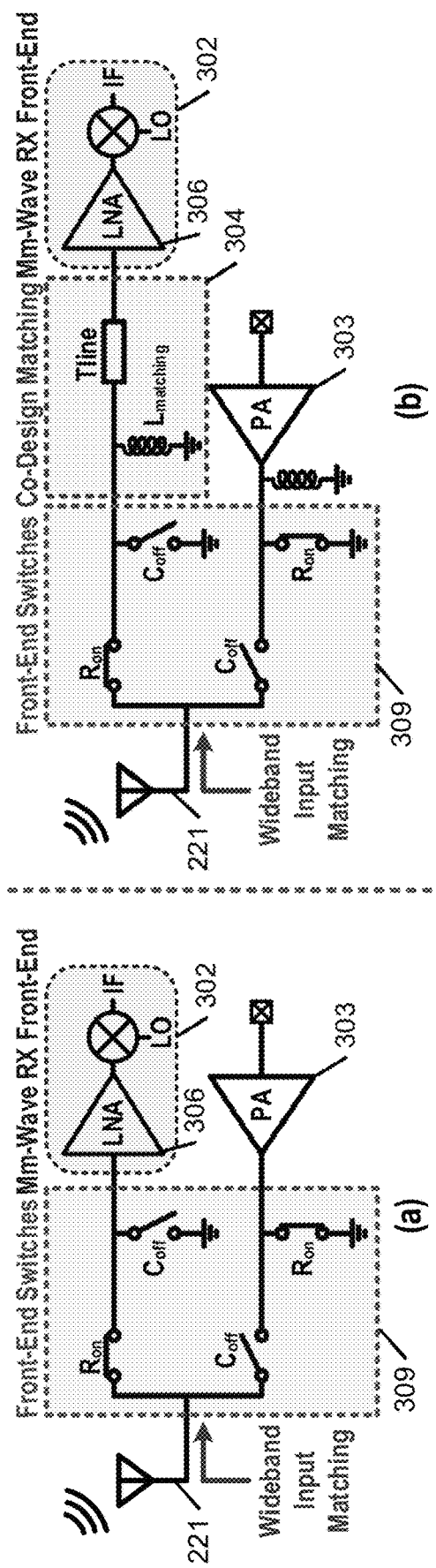
FIGS. 13A-13B are block diagrams illustrating examples of transceiver switches according to some embodiments.

FIGS. 13A-13B are block diagrams illustrating examples of transceiver T/R switches according to some embodiments. Referring to FIG. 13A, LNA 306 is directly coupled to T/R switches 309. Here, an input impedance of LNA 306 is designed to match an output impedance of switches 309. However, the loading capacitances of off-switches for switches 309 (e.g., Coff) and PA 303 can directly load on to the input of the LNA thus degrading a performance of receiver 302. FIG. 13B illustrates LNA 306 coupled to T/R switches 309 via co-design matching network 304. Network 304 can include an inductor (e.g., Lmatching) in series with an inductive transmission line (Tline) coupled in between LNA 306 and T/R switches 309. The inductor(s) can resonate with loading and/or parasitic capacitances seen by the matching network to resonate at one or more resonant frequencies.

Figure 14A:
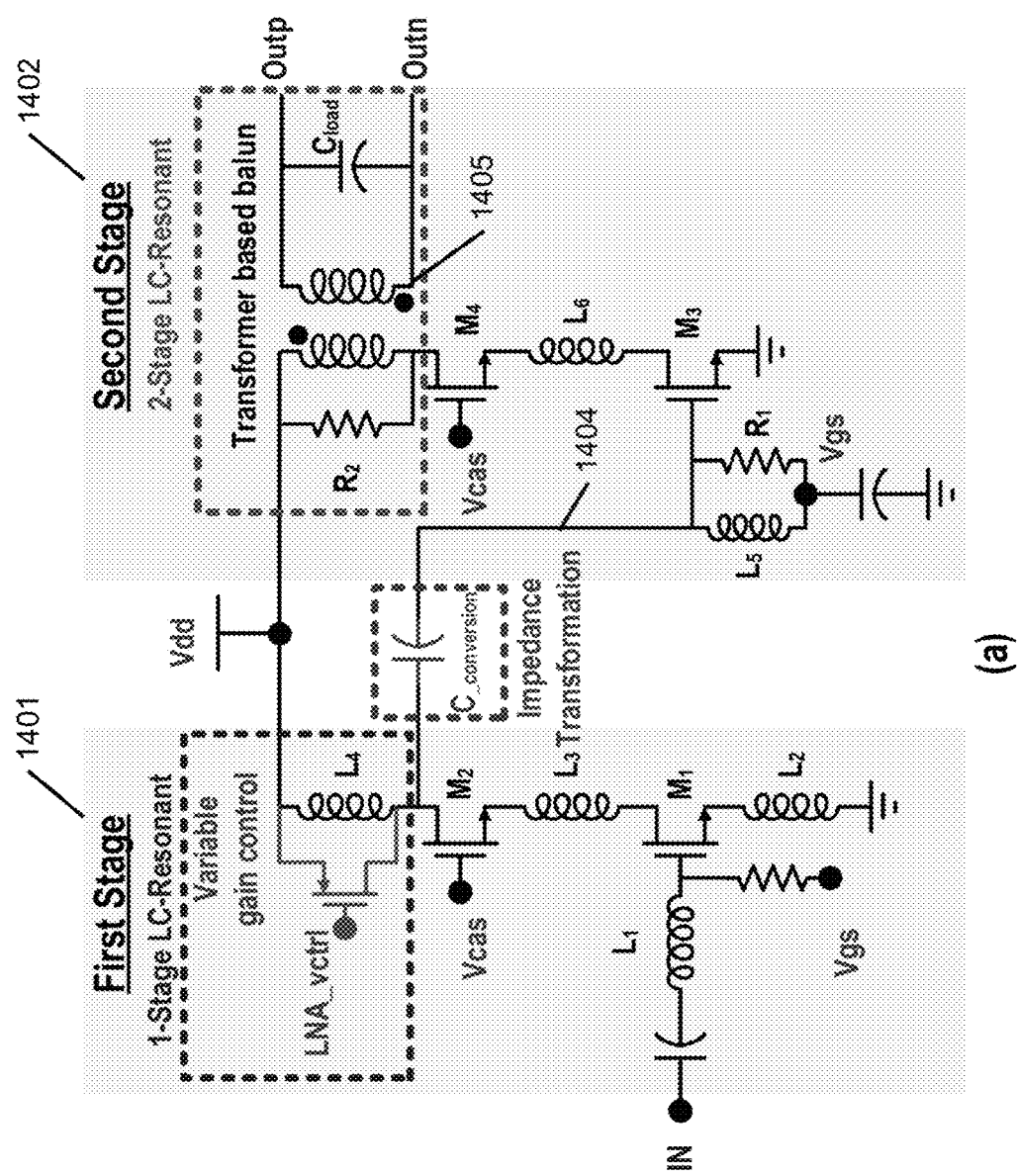
FIG. 14A is a block diagram illustrating an example wideband LNA circuit according to one embodiment.

FIG. 14A is a block diagram illustrating an example wideband LNA circuit according to one embodiment. LNA is an amplifier that can amplify a low power RF signal without significantly degrading its signal to noise ratio.

Referring to FIG. 14A, LNA 306 includes a first (amplifier) stage 1401 and a second (amplifier) stage 1402. The first stage 1401 can be implemented in a source inductive degeneration topology to achieve wideband input matching with high linearity, e.g., a source terminal of transistor M1 is coupled to inductor L2. An LNA based on the inductively degenerated common-source stage can achieve a low noise figure.

In one embodiment, inductor L1 is coupled in between a gate terminal of transistor M1 and an input port (IN). Referring to FIG. 14A, inductors L1, L2 together with a parasitic gate capacitance (e.g., Cgs and/or Cgd) and/or a source capacitance of transistor M1 can be configured to resonate at dual-resonance for a broadband input impedance matching. The inductive degeneration topology can include transistors M1 and M2 and a current gain peaking inductor (e.g., inductor L3) coupled in between transistors M1 and M2. Inductor L3 is selected to form a C-L-C like transmission line with parasitic capacitances of transistors M1 (e.g., Cds) and M2 (e.g., Cgs) to deliver a high frequency amplified signal from transistor M1 to transistor M2. Without inductor L3, parasitic capacitances Cds of M1 and Cgs of M2 would leak a RF current signal along M1-M2 which lowers a gain and degrades a noise figure of the overall LNA.

In one embodiment, first stage 1401 can include a variable gain control to adjust a gain for the first stage to adjust an input linearity of LNA 306. The variable gain control can include a pnp transistor (e.g., PMOS) coupled to a drain terminal of transistor M2. The pnp transistor receives a LNA_vctrl signal at the gate terminal for adjusting the gain control of the first stage. In one embodiment, inductor L4 is coupled to a drain terminal of transistor M2 (e.g., at a drain and a source terminal of the pnp transistor) to resonate at a first resonant frequency or first resonance.

For the second stage 1402, signal 1404 is amplified by M3 and M4 transistors. Similar to L3 with transistors M1 and M2, current gain peaking inductor L6 is inserted between M3 and M4 transistors to form a C-L-C like transmission line with parasitic capacitances of transistors M3 (e.g., Cds) and M4 (e.g., Cgs) seen by inductor L6 to deliver a high frequency amplifier signal from M3 to M4. Similar to inductor L3, without inductor L6, parasitic capacitances Cds of M3 and Cgs of M4 would leak a RF current signal along M3-M4 which lowers a gain and degrades a noise figure of the overall LNA.

In one embodiment, transformer-based balun 1405 is coupled to a drain terminal of M4 so high frequency signals at the drain terminal of M4 can be transformed from single-ended into differential (e.g., balanced) components (e.g., at ports Outp and Outn) by transformer-based balun 1405. A balun is a type of transformer used to convert an unbalanced signal to a balanced signal or vice versa. A balanced signal includes two signals carrying signals equal in magnitude but opposite in phase. An unbalanced signal includes a single signal working against a ground signal. A balanced signal allows for a balanced configuration for the next stages (e.g., mixer 307) to guard against RF-LO, LO-IF, and RF-IF signal leakages. Here, the passive loss of transformer-based balun 1405 is minimized because transformer-based balun 1405 is coupled next to the output ports of LNA 306 (e.g., at second stage 1402, right before output ports Outp and Outn). Furthermore, a primary winding inductance of a transformer of the transformer-based balun can resonate with Cgs of transistor M4 at a second resonant frequency. The second resonant frequency of the second stage, along with the first resonant frequency of the first stage, can achieve a wideband frequency extension for a corresponding conversion gain bandwidth.

In one embodiment, a gate terminal of transistor M3 is coupled to a passive network circuit. The passive network circuit can include inductor L5 in parallel with resistor R1. In one embodiment, a C_conversion capacitor is coupled in between the first stage (e.g., drain terminal of transistor M2) and the second stage (e.g., gate terminal of transistor M3). The C_conversion can impedance transform a gate capacitance (e.g., Cgs) of M3 and/or the impedance of the passive network circuit (e.g., L5 in parallel with R1) to an optimal load for the first stage. Note that although the LNA is shown with only two stages, additional stages can be implemented, e.g., a three-stage LNA, etc.

Figure 14B:
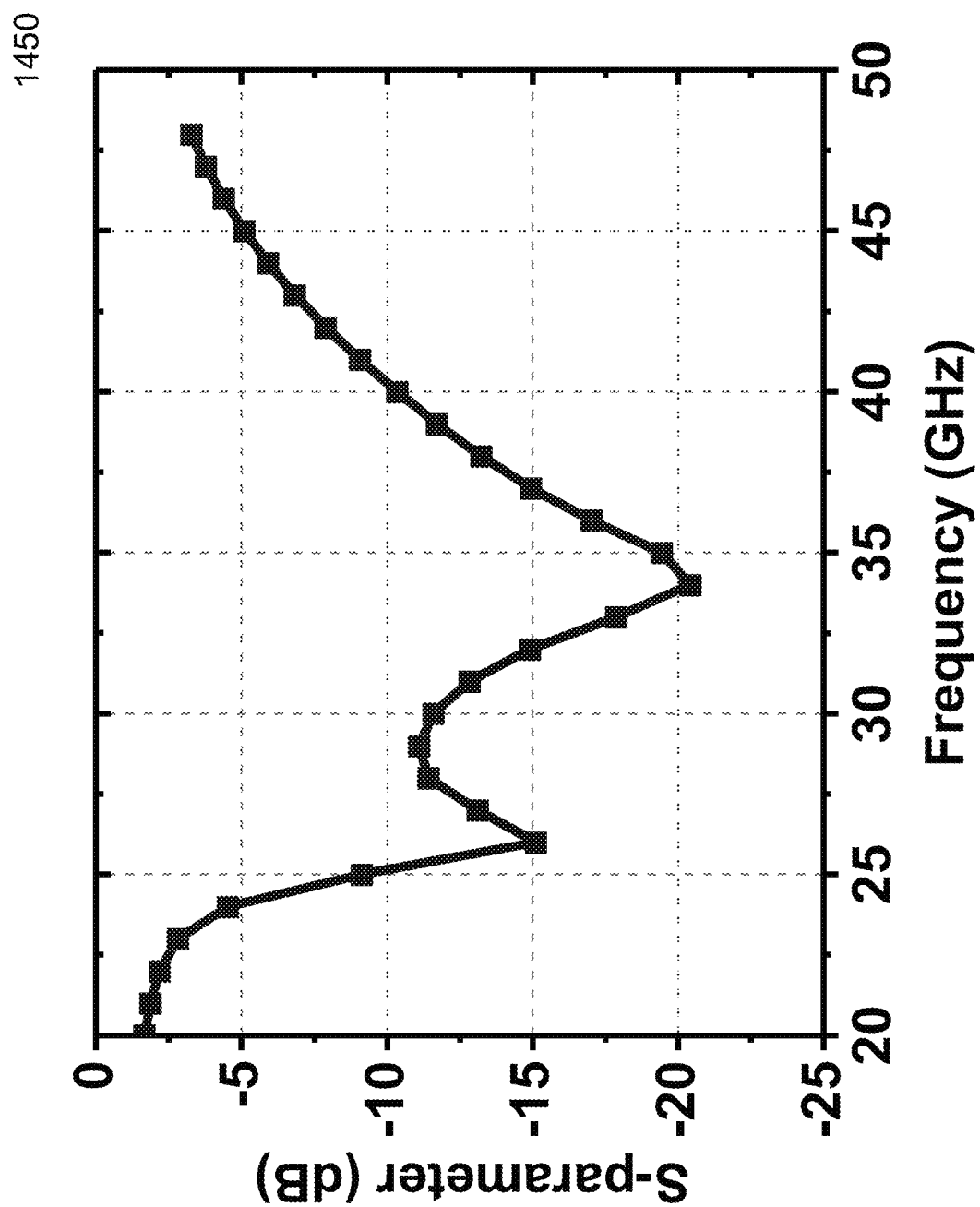
FIG. 14B is a chart illustrating S-parameter (S11) for a wideband LNA circuit according to one embodiment.

FIG. 14B is a chart illustrating S-parameter (S11) for an example wideband LNA circuit according to one embodiment. Chart 1450 can be a S11 plot for LNA 306 of FIG. 14A. As shown by the S11 plot, LNA 306 has dual resonance at 26 GHz and 34 GHz, which can be achieved by tuning inductors L1 and L2 of LNA 306 of FIG. 14A. S11 is approximate <−16 dB at the two resonant frequencies and approximate <−10 dB for a frequency range of approximately 25 to 40 GHz.

Figure 14C:
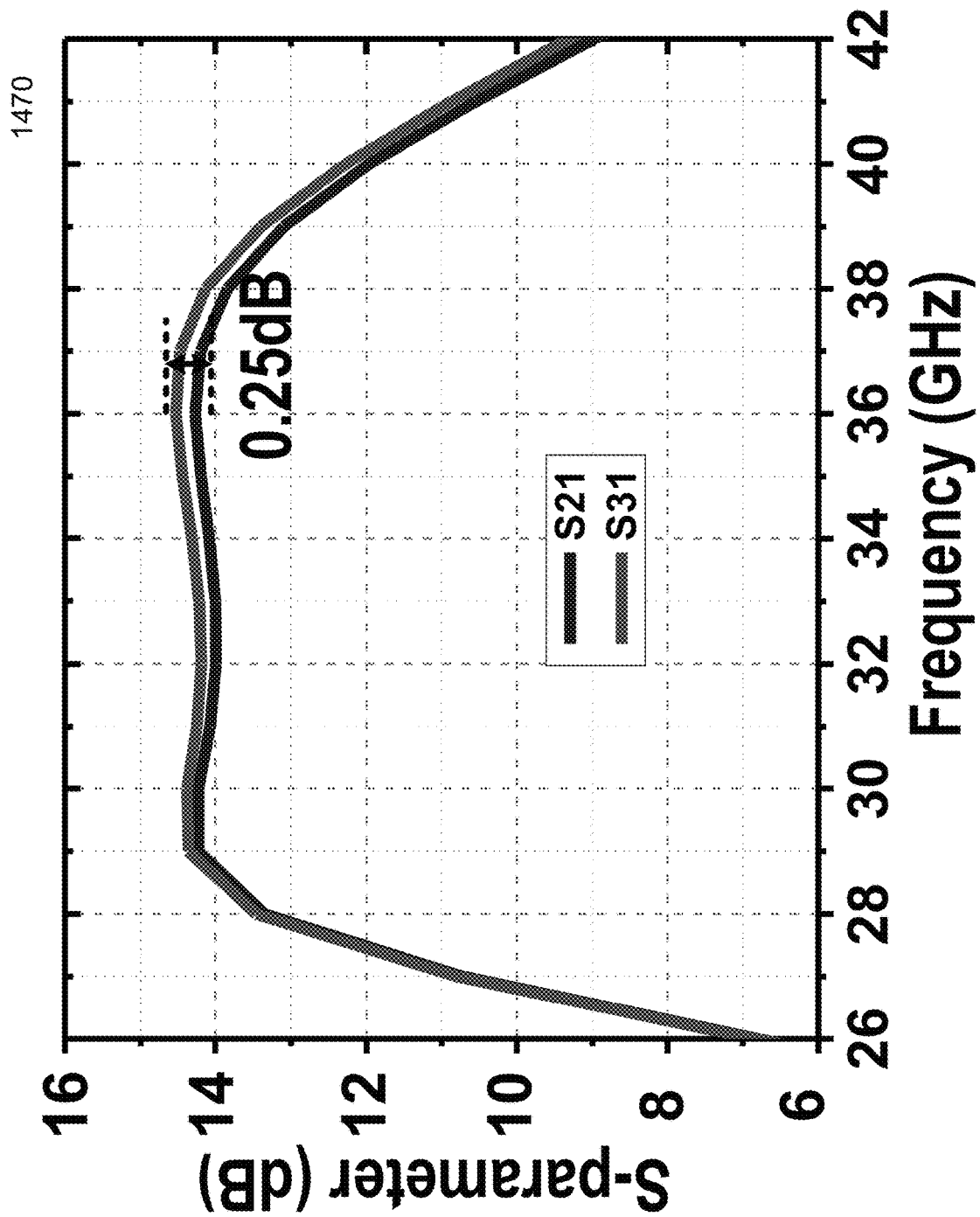
FIG. 14C is a chart illustrating conversion gains (S-parameters S21 and S31) for a wideband LNA circuit according to an embodiment.

FIG. 14C is a chart illustrating conversion gains (or S-parameters S21 and S31) for an example wideband LNA circuit according to an embodiment. Referring to FIG. 14C, chart 1470 can be a conversion gain plot for LNA 306 of FIG. 14A. As show, the single-end to single-end gains are approximately 14 dB (e.g., S21 and S31 for input port 1 to output ports outp 2 and outn 3). The differential to single-ended gain is thus approximately 17 dB from the single-end input port to the differential output ports. Referring to FIGS. 14B-14C, in one embodiment, the S11 (>−10 dB) bandwidth and the 3-dB S21 gain bandwidth covers a frequency range of approximately 27 GHz to approximately 40 GHz.

Figure 15A:
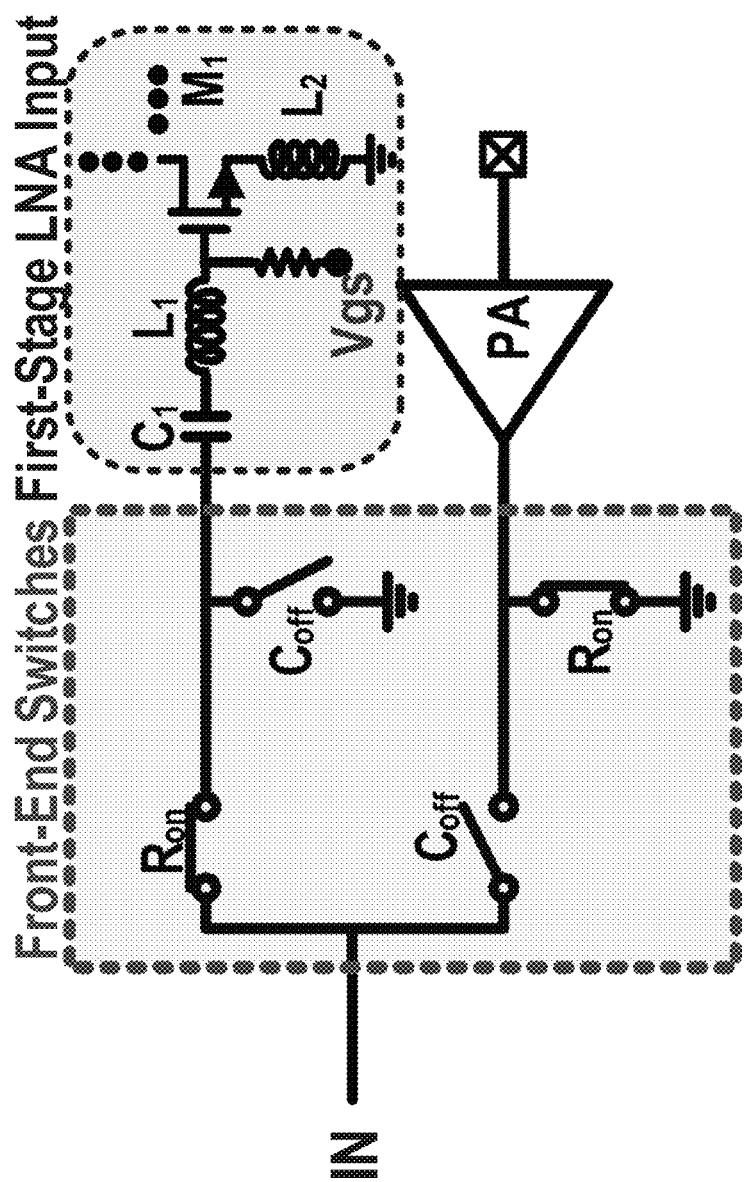
FIG. 15A is a block diagram illustrating an example wideband LNA circuit without a co-design matching network according to one embodiment.
Figure 15B:
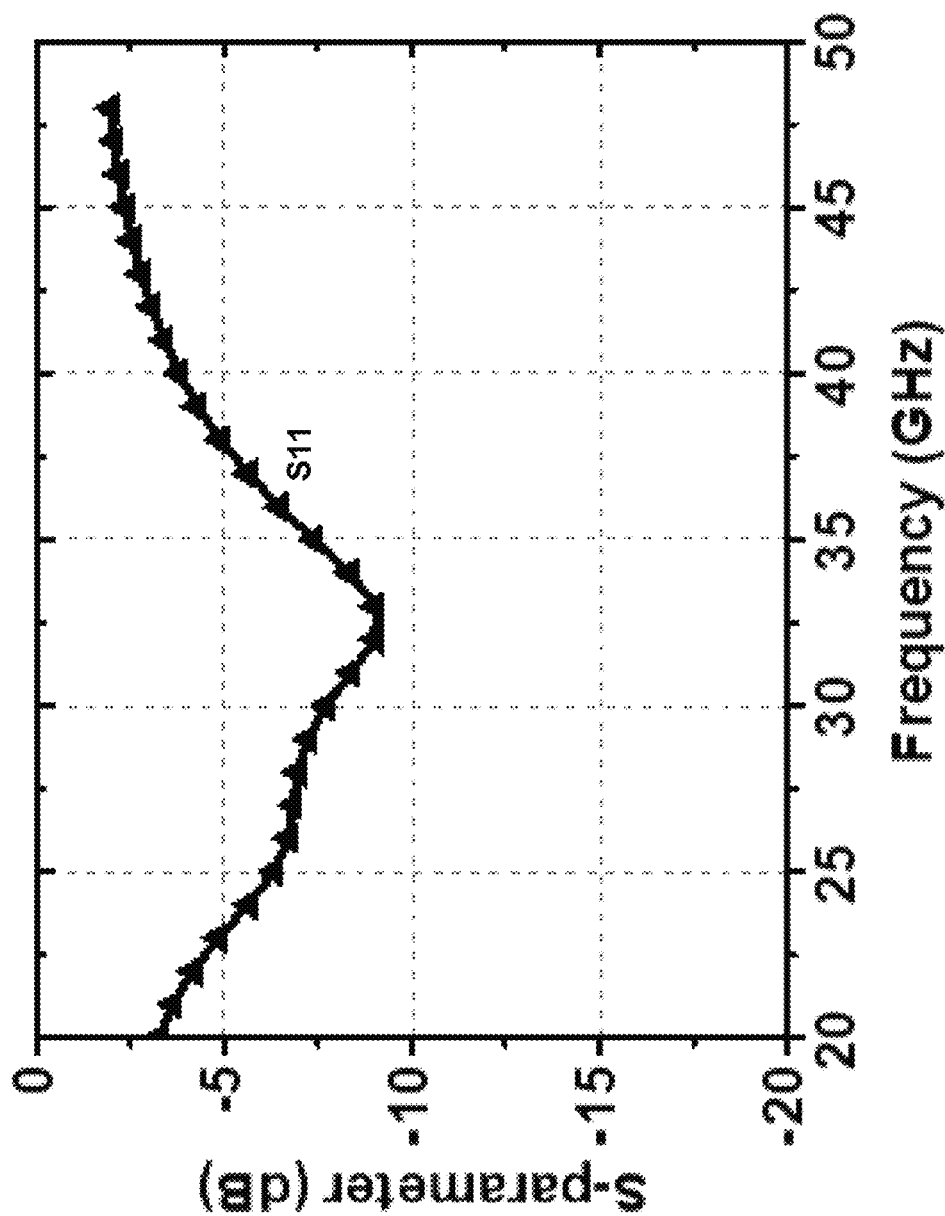
FIG. 15B is a block diagram illustrating S-parameter (S11) for a wideband LNA circuit without a co-design matching network according to one embodiment.

FIG. 15A is a block diagram illustrating an example wideband LNA circuit without a co-design matching network according to one embodiment. FIG. 15B is a block diagram illustrating S-parameter (S11) for input matching for a wideband LNA circuit without a co-design matching network according to one embodiment (e.g., FIG. 15A). In this case, once LNA 306 is loaded with T/R switches 309 and off-state power amplifier (PA) 303 as shown in FIG. 15A, the loading and/or parasitic capacitances of off-switches of T/R switches 309 and the off-state PA 303 degrade the overall receiver performance as shown by FIG. 15B. For T/R switches 309, Ron models the on-resistance of switch transistors and Coff models the off-capacitance of the switch transistors. The overall receiver input matching S11 is >−10 dB over a frequency range of approximately 20-49 GHz, e.g., an entire band of interest for 5G MIMO communication. In other words, most of the received signals are reflected rather than received by the receiver leading to suboptimal performances (e.g., receiver bandwidth, conversion gain, sensitivity, and noise figure, etc.) at the mm-Wave frequencies.

Figure 16A:
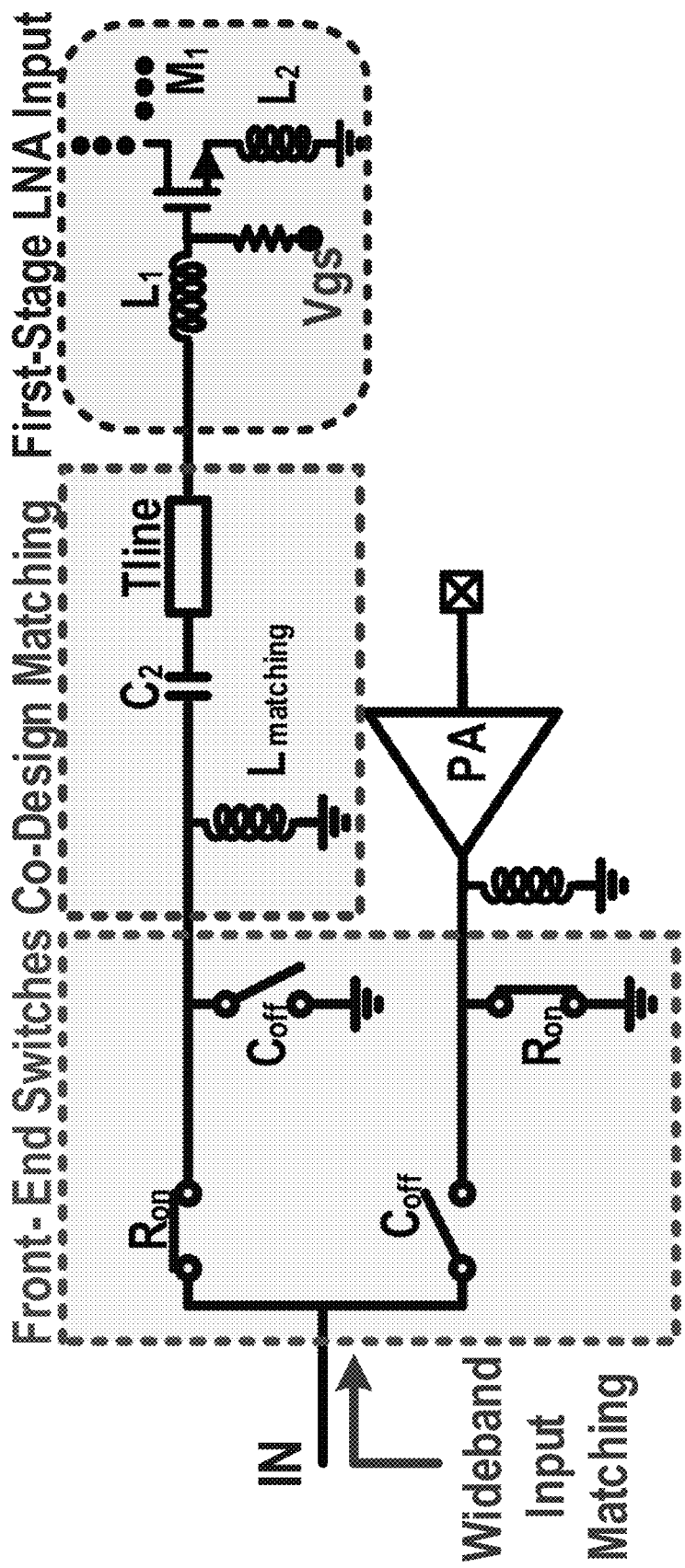
FIG. 16A is a block diagram illustrating an example wideband LNA circuit with a co-design matching network according to one embodiment.
Figure 16B:
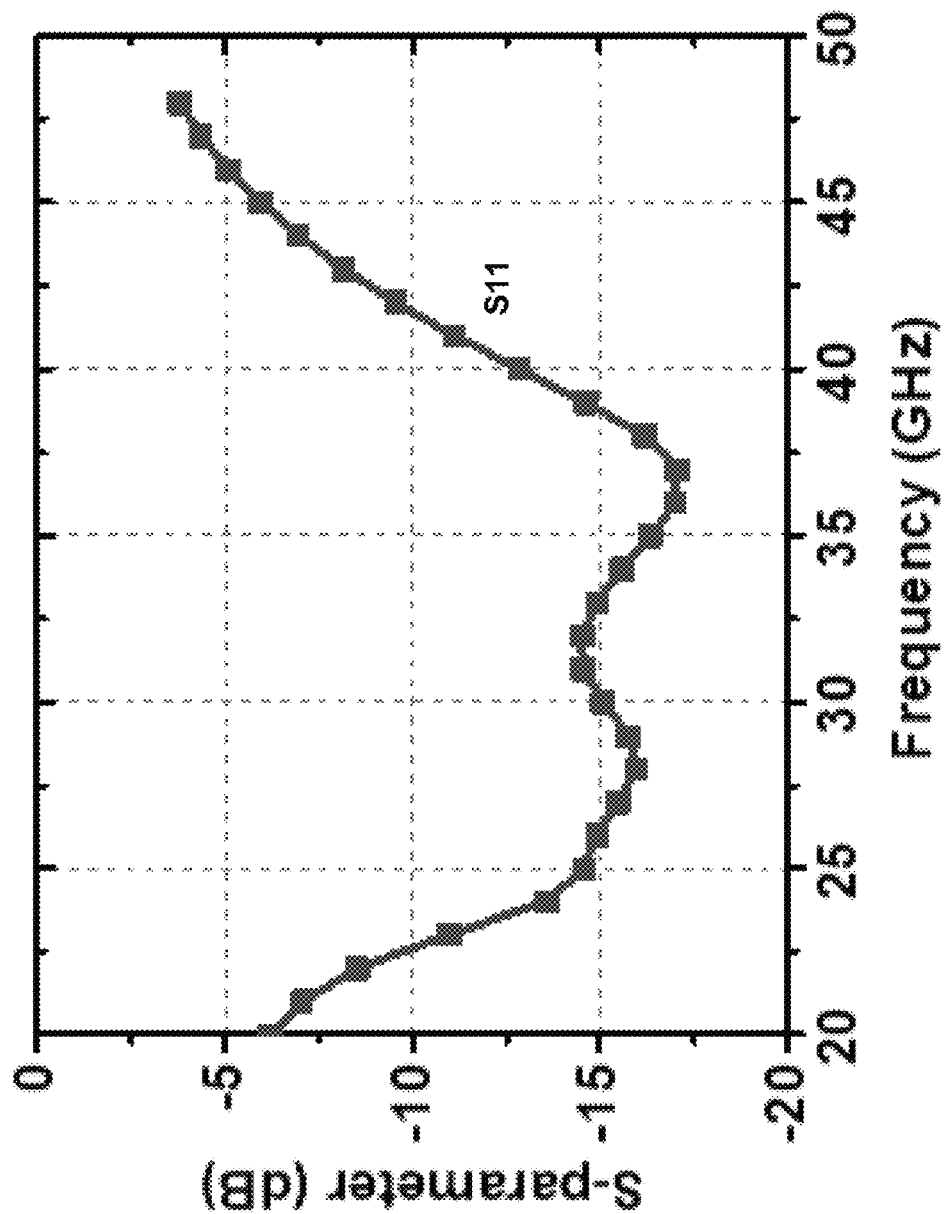
FIG. 16B is a block diagram illustrating S-parameter (S11) for a wideband LNA circuit with a co-design matching network according to one embodiment.

FIG. 16A is a block diagram illustrating an example wideband LNA circuit with a co-design matching network according to one embodiment. FIG. 16B is a block diagram illustrating S-parameter (S11) for input matching for a wideband LNA circuit with a co-design matching network according to one embodiment (e.g., FIG. 16A). Referring to FIG. 16A, matching network 304 includes a transmission line (Tline) that bridges T/R switches 309 to LNA 306.

In one embodiment, matching network 304 includes Lmatching to resonate with capacitances (e.g., Coff) of T/R switches 309 and capacitances for off-state PA 303. Referring to FIG. 15A, capacitance C1 (approximately 1 pF) is typically coupled to an input of an LNA to block a DC signal received by the receiver, however, C1 can cause signal loss due to a capacitive voltage division between C1 and parasitic capacitors see at a gate node of transistor M1. Referring to FIG. 16A, in one embodiment, matching network 304 includes capacitance C2 coupled to Tline. Here, in contrast, capacitance C2 (approximately 270 fF) can (1) create a high-order resonance with Tline and series gate inductor L1 and (2) block a DC signal for the receiver front-end without a signal loss due to a capacitive voltage division.

In one embodiment, matching network 304 includes multiple resonating LC pairs, including (1) a first LC pair from Coff of T/R switch and load capacitor of the PA resonating with Lmatching, (2) a second LC pair from C2 with Tline and L1, and (3) a third LC pair from gate-to-source parasitic capacitor of M1 with inductor L2. Having multiple resonating LC pairs, matching network 304 is similar to a high-order chebyshev filter that can achieve a broadband input matching at mm-Wave. For example, referring to FIG. 16B, in one embodiment, the input matching (S11) looking into the frontend switches of FIG. 16A can be approximately <−10 dB for a frequency range of approximately 22.5G to 42 GHz. Here, S11 of FIG. 16B includes multiple resonant frequencies in comparison with FIG. 15B extending a useful bandwidth of the receiver with the T/R switches.

Figure 17A:
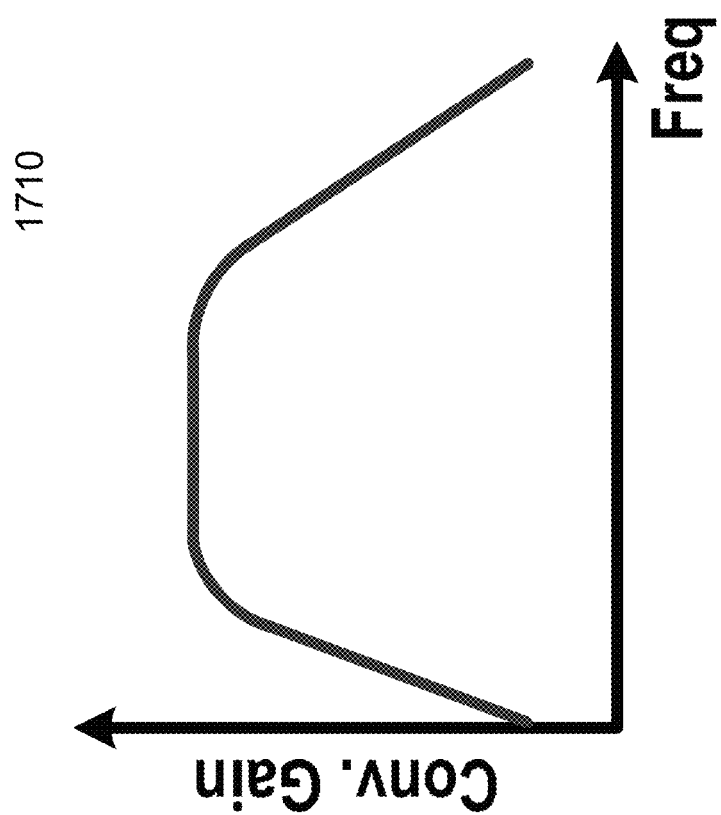
FIG. 17A is a chart illustrating conversion gains for the first stage LC resonance and the second stage LC resonance for a wideband LNA circuit according to an embodiment.
Figure 17B:
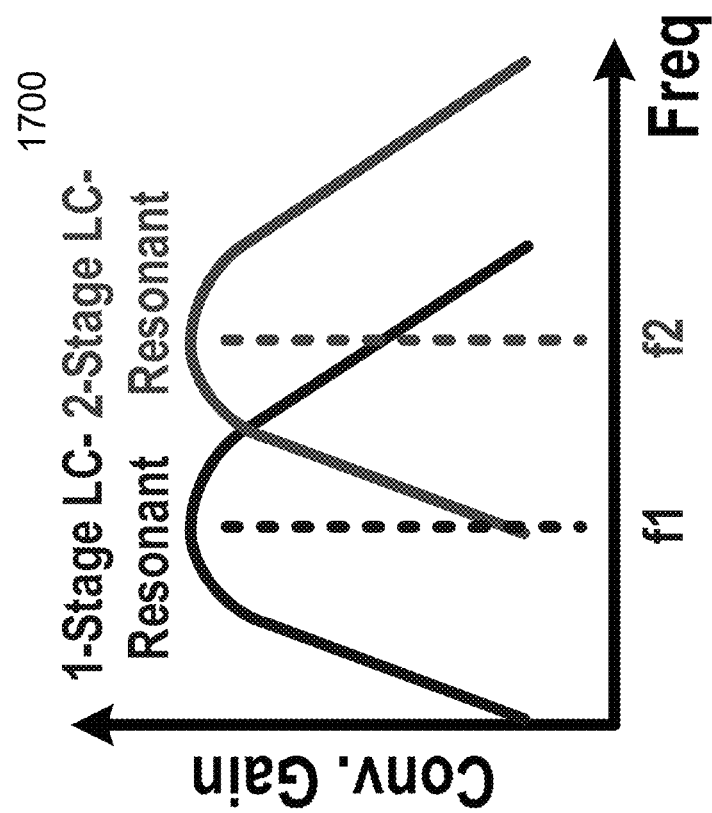
FIG. 17B is a chart illustrating a conversion gain for the combined first stage LC resonance and the second stage LC resonance for a wideband LNA circuit according to an embodiment.

FIG. 17A is a chart illustrating conversion gains for the first stage LC resonance and the second stage LC resonance for a wideband LNA circuit according to an embodiment. FIG. 17B is a chart illustrating a conversion gain for the combined first stage LC resonance and the second stage LC resonance for a wideband LNA circuit according to an embodiment. For example, FIGS. 17A-17B can be conversion gain charts for the wideband LNA circuit 306 of FIG. 14A.

Referring to FIG. 17A, chart 1700 shows a gain bandwidth extension by the two-stage resonant points which include a first resonant frequency f1 and a second resonant frequency f2. Here, f1 can correspond to a frequency of the first stage LC resonance (e.g., 26 GHz) and f2 can correspond to frequency of the second stage LC resonance (e.g., 34 GHz). Frequency f1 can be coarsely adjusted by selecting inductor L4 and frequency f2 can be coarsely adjusted by selecting a size of the transformer of the transformer-based balun, e.g., adjusting a primary winding inductance of the transformer which is coupled to transistor M4. Referring to FIG. 17B, chart 1710 shows the overall conversion gain bandwidth for the LNA for the two-stage resonant frequencies f1 and f2 of FIG. 17A. Referring to FIG. 17B, the conversion gain bandwidth covers a frequency range of approximately f1 to f2. Here, by shifting and separating the two resonant frequency f1 and 2, the LNA can be reconfigured for a wideband operation to cover a wider bandwidth.

Figure 18A:
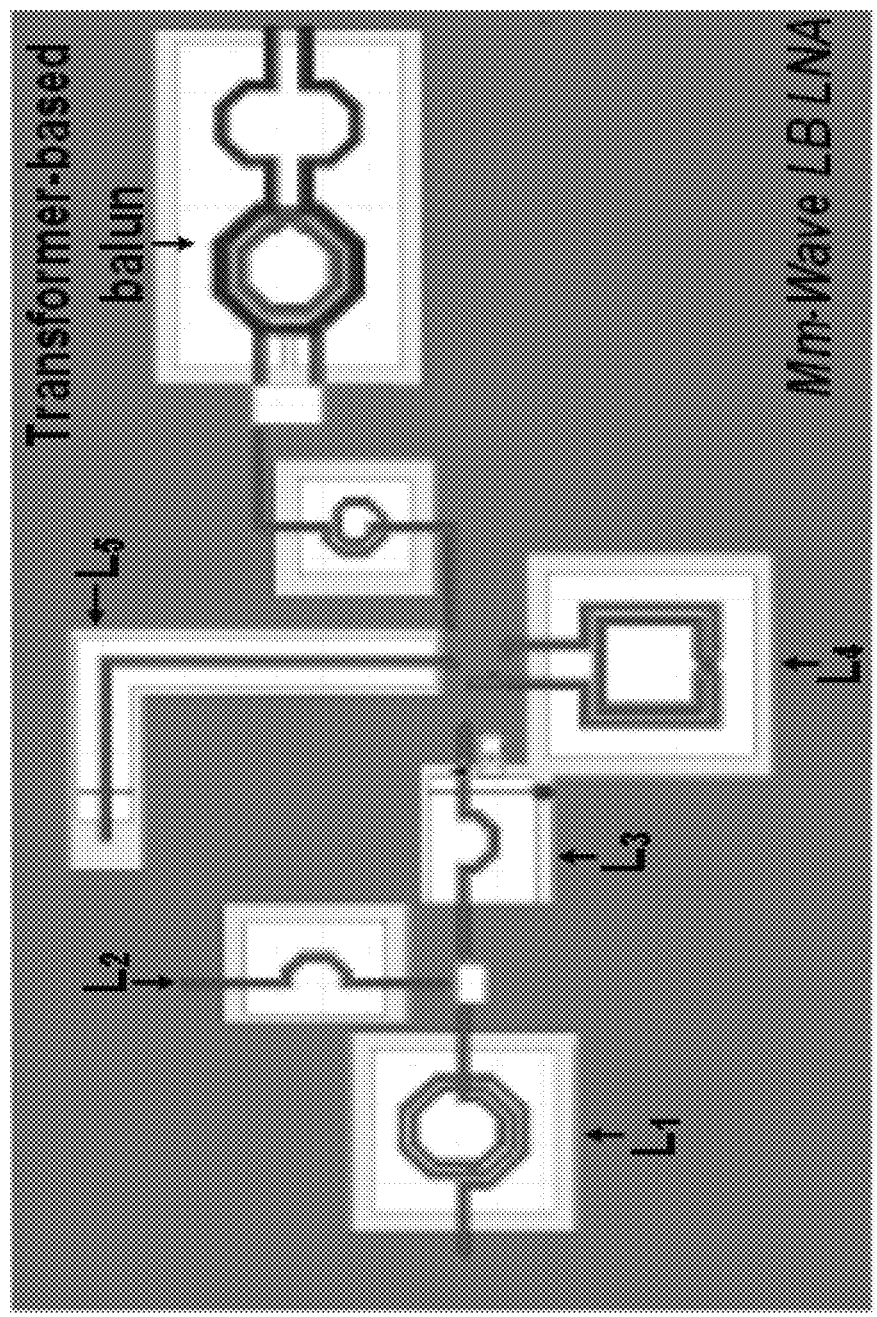
FIG. 18A is a block diagram illustrating an example EM model for a wideband LNA circuit according to one embodiment.
Figure 18B:
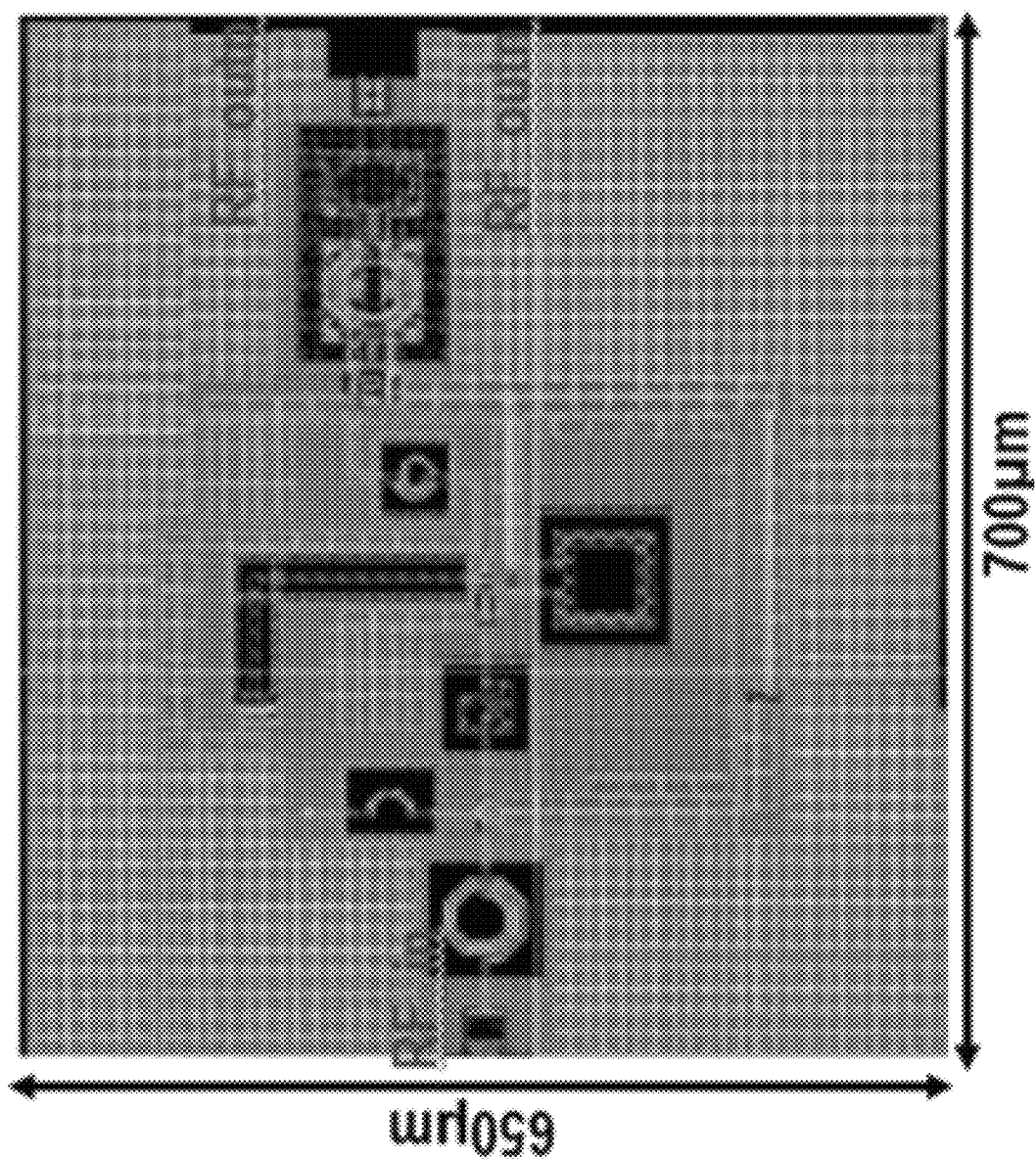
FIG. 18B is a block diagram illustrating an example EM layout for a wideband LNA circuit according to one embodiment.

FIG. 18A is a block diagram illustrating an example EM model for a wideband LNA circuit according to one embodiment. FIG. 18B is a block diagram illustrating an example EM layout for a wideband LNA circuit according to one embodiment. Referring to FIGS. 18A-18B, the overall LNA model/layout including bypass capacitors can have an approximately size of 650 µm by 700 µm.

Figure 19A:
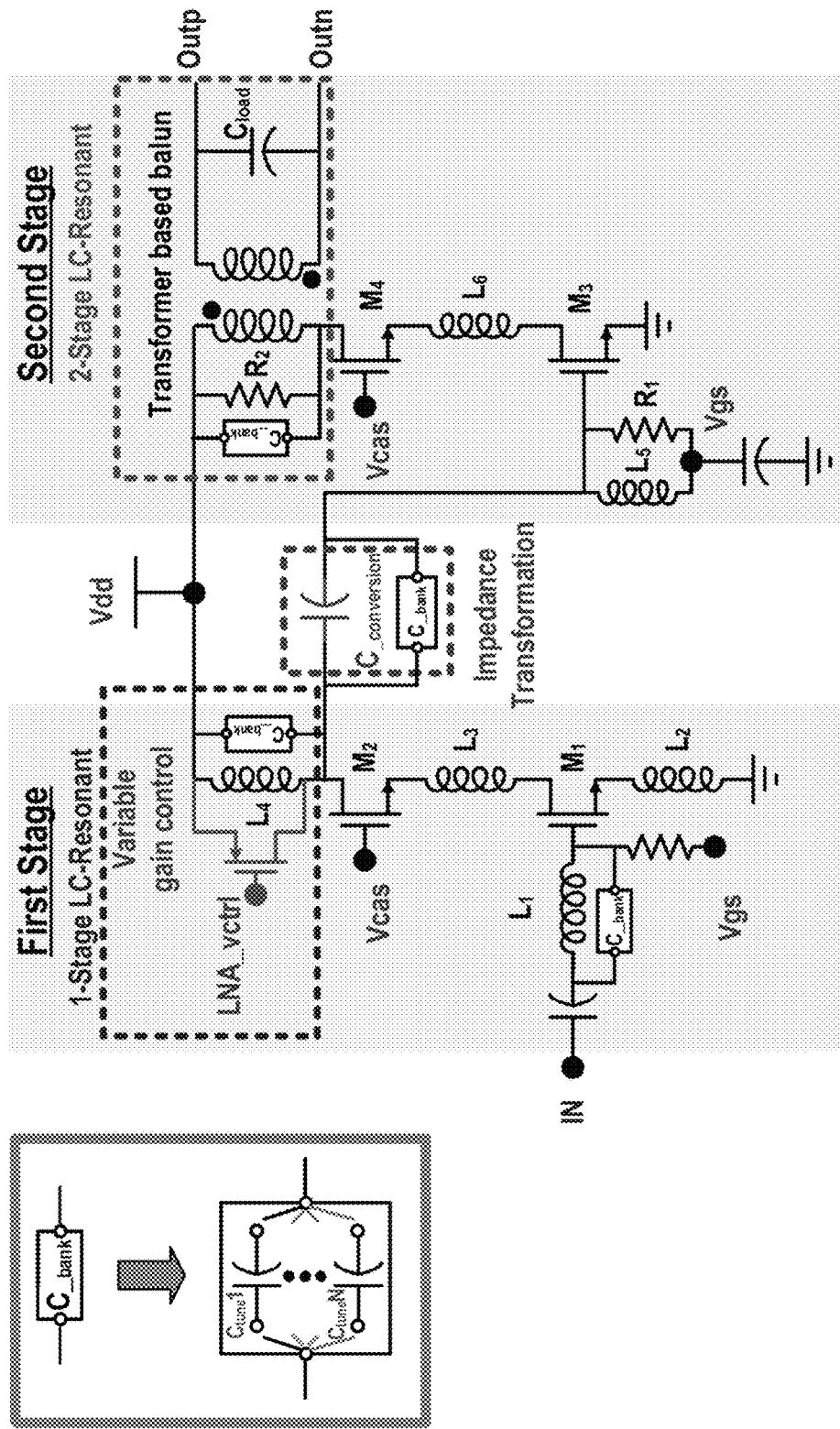
FIG. 19A is a block diagram illustrating an example wideband LNA circuit according to one embodiment.

In one embodiment, capacitor banks can be inserted near resonance sources, e.g., near resonant inductors, to improve an operating frequency range for the LNA. FIG. 19A is a block diagram illustrating an example wideband LNA circuit according to one embodiment. Referring to FIG. 19A, LNA 1900 can be LNA 306 of FIG. 14A. In one embodiment, LNA 1900 further includes a first capacitor bank coupled in parallel with inductor L1. In another embodiment, LNA 1900 includes a second capacitor bank coupled in parallel with inductor L4. In another embodiment, LNA 1900 includes a third capacitor bank coupled in parallel with C_conversion. In another embodiment, LNA 1900 includes a fourth capacitor bank coupled to two ends of a primary winding of the transformer of the transformer-based balun. In one embodiment, the first, second, third, and fourth capacitor banks can be programmable capacitors or digitally (or analog) tunable capacitors. By tuning the capacitors, the input matching dual-resonance and/or the first and the second resonance frequencies can be shifted to reconfigure an operating frequency range for LNA 1900.

Figure 19B:
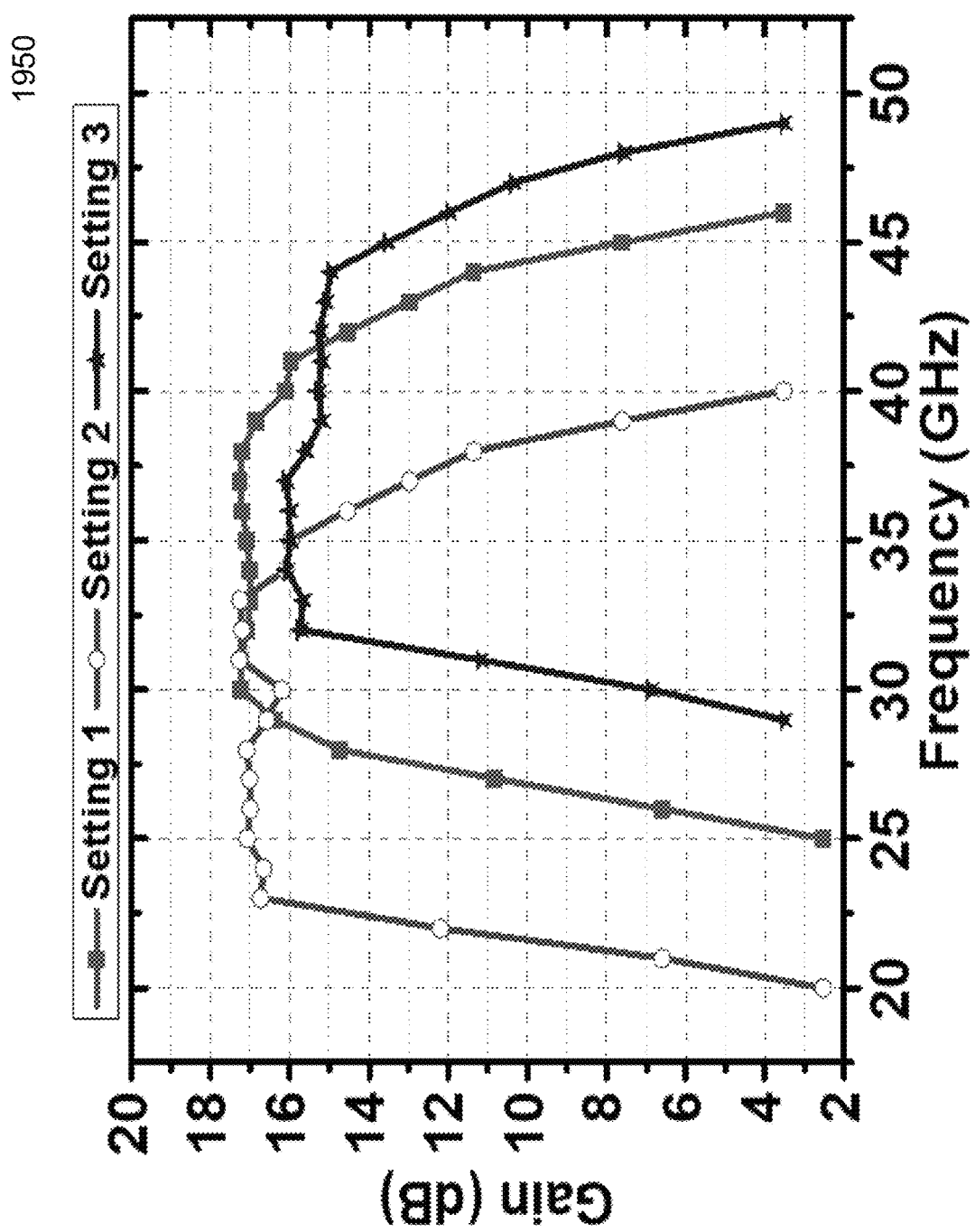
FIG. 19B is a chart illustrating conversion gains for a first amplifier stage, a second amplifier stage, and an impedance transformation stage of a wideband LNA circuit according to one embodiment.

FIG. 19B is a chart illustrating conversion gains for a first amplifier stage, a second amplifier stage, and an impedance transformation stage of a wideband LNA circuit according to one embodiment. Chart 1950 can be a conversion gain chart for LNA 1900 of FIG. 19A. Referring to FIG. 19B, in one embodiment, tuning the first, second, third, and fourth capacitor banks can reconfigure the operating frequency of LNA 1900 to a frequency range of approximately 21 GHz to 46 GHz, which can be a 38% to a 75% improvement over the frequency band of operation of LNA 306 of FIG. 14A as previously shown in FIG. 14C. Thus, the additional capacitor banks can reconfigure a frequency response of the LNA to operating the LNA at different frequency bands or ranges.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A low noise amplifier (LNA) circuit comprising:
   a first amplifier stage, comprising:
      a first transistor;
      a second transistor coupled to the first transistor;
      a first inductor coupled in between an input port and a gate of the first transistor; and
      a second inductor coupled to a source of the first transistor, wherein the first inductor and the second inductor resonates with a gate capacitance of the first transistor respectively for a dual-resonance input matching;
   a second amplifier stage, comprising:
      a third transistor;
      a fourth transistor coupled between the third transistor and an output port; and
      a passive network coupled to a gate of the third transistor; and
   a capacitor coupled in between the first and the second amplifier stages, wherein the capacitor transforms an impedance of the passive network to an optimal load for the first amplifier stage; and
   a transformer-based balun coupled between the output port and the fourth transistor.

2. The LNA circuit of claim 1, further comprising a third inductor coupled in between the first transistor and the second transistor for a C-L-C transmission line for the first amplifier stage to deliver a signal from the first transistor to the second transistor.

3. The LNA circuit of claim 1, further comprising a variable gain controller coupled to the first amplifier stage to control a gain of the first amplifier stage.

4. The LNA circuit of claim 1, further comprising a fourth inductor coupled to a drain of the second transistor to resonate with a drain capacitance of the second transistor at a first resonance.

5. The LNA circuit of claim 1, wherein the passive network comprises a fifth inductor in parallel with a first resistor.

6. The LNA circuit of claim 1, further comprising a sixth inductor coupled in between the third transistor and the fourth transistor for a C-L-C transmission line for the second amplifier stage to deliver an amplifier signal from the third transistor to the fourth transistor.

7. The LNA circuit of claim 1, wherein a primary winding of a transformer of the transformer-based balun is to resonate with a drain capacitance of the fourth transistor at a second resonance.

8. The LNA circuit of claim 1, further comprising a first capacitor bank coupled in parallel with the first inductor.

9. The LNA circuit of claim 8, further comprising a second capacitor bank coupled in parallel with the fourth inductor.

10. The LNA circuit of claim 9, further comprising a third capacitor bank coupled in parallel with the capacitor.

11. The LNA circuit of claim 10, further comprising a fourth capacitor bank coupled in parallel with the primary winding of the transformer of the transformer-based balun.

12. The LNA circuit of claim 11, wherein the first, the second, the third, and the fourth capacitor banks are programmable capacitors.

13. The LNA circuit of claim 11, wherein the first, the second, the third, and the fourth capacitor banks are digitally tunable capacitors.

14. A RF receiver circuit comprising an LNA circuit to amplify a received signal, the LNA circuit comprising:
    a first amplifier stage, comprising:
        a first transistor;
        a second transistor coupled to the first transistor;
        a first inductor coupled in between an input port and a gate of the first transistor;
        a first capacitor bank coupled in parallel with the first inductor; and
        a second inductor coupled to a source of the first transistor, wherein the first inductor and the second inductor resonates with a gate capacitance of the first transistor respectively for a dual-resonance input matching;
    a second amplifier stage, comprising:
        a third transistor;
        a fourth transistor coupled between the third transistor and an output port; and
        a passive network coupled to a gate of the third transistor; and
    a capacitor coupled in between the first and the second amplifier stages, wherein the capacitor transforms an impedance of the passive network to an optimal load for the first amplifier stage.

15. The RF receiver circuit of claim 14, further comprising a third inductor coupled in between the first transistor and the second transistor for a C-L-C transmission line for the first amplifier stage to deliver an amplifier signal from the first transistor to the second transistor.

16. The RF receiver circuit of claim 14, further comprising a variable gain controller coupled to the first amplifier stage to control a gain of the first amplifier stage.

17. The RF receiver circuit of claim 14, further comprising a fourth inductor coupled to the second transistor to resonate with a drain capacitance of the second transistor at a first resonance.

18. The RF receiver circuit of claim 14, wherein the passive network comprises a fifth inductor in parallel with a first resistor.

19. The RF receiver circuit of claim 14, further comprising a sixth inductor coupled in between the third transistor and the fourth transistor for a C-L-C transmission line for the second amplifier stage to deliver an amplifier signal from the third transistor to the fourth transistor.

20. A radio frequency (RF) frontend circuit comprising an RF receiver to receive an RF signal, the RF receiver comprising an LNA to amplifier the received RF signal, the LNA comprising:
    a first amplifier stage, comprising:
        a first transistor;
        a second transistor coupled to the first transistor;
        a first inductor coupled in between an input port and a gate of the first transistor; and
        a second inductor coupled to a source of the first transistor, wherein the first inductor and the second inductor resonates with a gate capacitance of the first transistor respectively for a dual-resonance input matching;
    a second amplifier stage, comprising:
        a third transistor;
        a fourth transistor coupled between the third transistor and an output port; and
        a passive network coupled to a gate of the third transistor, the passive network having a fifth inductor in parallel with a first resistor; and
    a capacitor coupled in between the first and the second amplifier stages, wherein the capacitor transforms an impedance of the passive network to an optimal load for the first amplifier stage.

* * * * *